United States Patent [19]

Puri et al.

[11] Patent Number: 5,469,367
[45] Date of Patent: Nov. 21, 1995

[54] METHODOLOGY AND APPARATUS FOR MODULAR PARTITIONING FOR THE MACHINE DESIGN OF ASYNCHRONOUS CIRCUITS

[75] Inventors: Ruchir Puri; Jun Gu, both of Calgary, Canada

[73] Assignee: University Technologies International Inc., Calgary, Canada

[21] Appl. No.: 254,186

[22] Filed: Jun. 6, 1994

[51] Int. Cl.$^6$ .................................................. G06F 17/50
[52] U.S. Cl. ............................................ 364/489; 364/488
[58] Field of Search .................................... 364/488, 489, 364/490, 491, 578

[56] References Cited

U.S. PATENT DOCUMENTS

| | | | |
|---|---|---|---|
| 4,912,348 | 3/1990 | Maki et al. | 307/465 |
| 4,937,765 | 6/1990 | Shupe et al. | 364/570 |
| 5,005,136 | 4/1991 | Van Berkel et al. | 364/490 |
| 5,331,568 | 7/1994 | Pixley | 364/489 |
| 5,371,683 | 12/1994 | Fukazawa et al. | 364/489 |

Primary Examiner—Kevin J. Teska
Assistant Examiner—Susan Wieland
Attorney, Agent, or Firm—Daniel L. Dawes

[57] ABSTRACT

A machine methodology for designing asynchronous circuits utilizes a modular approach for the synthesis of asynchronous circuits from signal transition graphs, partitions the signal transition graph into a number of simpler and more manageable modules. Each modular graph is then individually solved. The results of the small graphs are then integrated together to provide a solution to the asynchronous circuit design problem as defined by a given asynchronous behavioral specification. A satisfiability solver for Boolean output function utilizing a binary decision diagram is incorporated in one embodiment which is comprised of a structural SAT formula preprocessor and a complete, incremental SAT processor which is specifically designed to find an optimal solution. The preprocessor compresses a large size SAT formula representing a circuit into a number of smaller SAT formulas. Each small size SAT formula is then solved by the BDD SAT processor. The results of these subsolutions are then integrated together to contribute to the solution of the original larger design problem.

19 Claims, 20 Drawing Sheets

INPUTS : pi, t
OUTPUTS : po, s

STATE CODE : pi t po s

STATE CODE : pi t po s
STATE SIGNAL : $n_1$, $n_2$

STATE CODE: pi t po s

STATE CODE: pi t po

STATE SIGNAL: $n_1$
STATE CODE: pi t po

STATE CODE: pi t po s
STATE SIGNAL: $n_1$

STATE CODE: pi t po n₁

STATE GRAPH GENERATION →

↓ STATE SIGNAL INSERTION TO SATISFY CONSTRAINTS

← CONSTRAINT EXTRACTION

| MULTI-VALUED VARIABLES ENCODED AS BINARY VALUED VARIABLES ||
|---|---|
| MV | BINARY |
| $(n_{01})$ | $n_{01a}\ n_{01b}$ |
| $(n_{11})$ | $n_{11a}\ n_{11b}$ |
| $(n_{21})$ | $n_{21a}\ n_{21b}$ |
| $(n_{31})$ | $n_{31a}\ n_{31b}$ |
| $(n_{41})$ | $n_{41a}\ n_{41b}$ |

↓ CONSTRAINT BDD GENERATION AND STATE SIGNAL ASSIGNMENT c

METHODOLOGY AND APPARATUS FOR MODULAR PARTITIONING FOR THE MACHINE DESIGN OF ASYNCHRONOUS CIRCUITS

BACKGROUND OF THE INVENTION

1. Field of the Invention

The invention relates to the field of automated design of asynchronous digital circuits, and in particular to an apparatus and methodology for designing asynchronous and combinations of synchronous and asynchronous circuits.

2. Description of the Prior Art

Asynchronous logic circuits are present in and critical in the design of low power, delay sensitive, high performance digital circuits. Typically, asynchronous logic circuits are used in real time applications involving digital communication and computer systems. Although there are some automated methodologies which can provide machine design of some types of asynchronous circuits, heretofore no practical automated methodology has existed which could successfully provide design solutions for real applications. Therefore, the solution of complex asynchronous circuit design problems always required intuition and experience, and was consequently a difficult and error prone task. Often the design of the asynchronous circuit entails a substantial amount of time to debug. What is needed is an adequate synthesis method which will simplify design and reduce errors.

Asynchronous interface circuits as used in real time digital systems, combined various microprocessors, memories and other asynchronous interface circuits, each of which either operate at different clock rates or asynchronously from each other. Prior art attempts to devise a general solution resulted in the development of an event-based graphically specification, called a signal transition graph (STG). See Tam-Anh Chu, "Synthesis of Self-Timed VLSI Circuits from Graph Theoretic Specifications," PhD Thesis, Department of Electrical Engineering and Computer Science, MIT, June 1987, and a direct synthesis method as shown in Chu, supra; Lavagno et al., "Algorithms for Synthesis of Hazard-Free Asynchronous Circuits," Proc. of 28th DAC, at 302–08 (1991); Vanbekbergen et al., "Optimized Synthesis of Asynchronous Control Circuits front Graph Theoretic Specifications," IEEE Trans. on CAD, 11(11):1426–38 (1992); and Yu et al., "A New Approach for Checking Unique State Coding Property of Signal Transition Graphs," Proc. of EDAC, at 312–21 (1992). These prior attempts were inadequate to synthesize complex designs involving a large number of constraints.

The prior art methods were limited by the types of asynchronous behavioral specifications that could be synthesized. For example, some prior art techniques as described by Lin, "Automatic Synthesis of Asynchronous Circuits," Proc. of 28 DAC at 296–301 (1991), Vanbekbergan and Yu each propose synthesis techniques which are restricted to STG graphs which describe only concurrent asynchronous behavior. These prior art techniques were also limited by the additional restriction that every signal could only have one rising and one falling transition. Lavagno et al., "Solving the State Assignment Problem for Signal Transition Graphs," Proc. 29th DAC at 568–72 (1992), proposed a synthesis methodology from STG specifications with a limited interplay of concurrency and choice. The signal transition graph was solved by transforming it into a finite state machine state table.

The synthesis problem was solved with state minimization as shown by Puri and Gu, "An Efficient Algorithm to Search for Minimal Closed Covers in Sequential Machines," IEEE Transactions on CAD, 12(6):737–45 (1993) and with critical hazard-free state assignment techniques, as shown by Tracey, "Internal State Assignment for Asynchronous Sequential Machines," IEEE Trans. on Computers 15(4):551–60 (1966). Still, the state coding solutions obtained by this methodology corresponded only to a special class of STG transformations. Vanbekbergen et al., "A Generalized State Assignment Theory for Transformations on Signal Transition Graphs," Proc. of ICCAD at 112–17 (1992), provided a solution to the state coding problem for general STG specifications which was not limited to only concurrent and synchronous behavior or safe flee-choice Petri nets. The state coding problem was, thus, formulated as a Boolean satisfiability (SAT) problem. Unfortunately, Boolean formula derived from practical signal transition graphs are too large to be efficiently solved. For example, a moderately sized signal transition graph with 174 states results by this methodology in a Boolean formula with 35,386 clauses and 1,044 signal variables. It usually takes prohibitively long times to find a satisfiable assignment for such a very large Boolean formula. In many cases, the formulas could only be solved by utilizing some human insight into the structure of the problem. What is needed is a solution which can be produced through automated software by machine without these disadvantages.

Dangelo et al., "Methodology for Deriving Executable Low-Level Structural Descriptions and Valid Physical Implementations of Circuits and Systems from High-Level Semantic Specifications and Descriptions Thereof," U.S. Pat. No. 5,222,030 (1993) shows in connection with FIG. 2 a methodology utilizing a partition step 3 which simplifies overall synthesis, analysis and verification tasks by breaking the design into separate modules. Consulting package requirements, input/output capabilities, and other technological dependent information bearing on the design and process yields are used to form optimally partitioned modules. For each partition module, the modular description step 4 generates the register transfer level description within the set of timing and area design constraints accompanying that particular module. The design constraints are related only to that module's domain. The module descriptions which are generated are then examined, verified and combined in composition step 5 in order to reconstruct the design that will ultimately be synthesized.

Maki et al., "Method for Designing Pass Transistor Asynchronous Sequential Circuits," U.S. Pat. No. 4,912,348 (1990) describes a method for designing pass transistor asynchronous sequential circuits wherein each pass transistor path of the circuit's state variables to a stable state under a given input signal is separately partitioned. The approach is essentially to avoid critical race conditions between the circuit state variables by employing state assignments in which the transition paths between the states are disjoint. Partitioning enables a transition path consisting of all the states that the circuit could assume in transition between an unstable state and a stable state for given input to be separately realized. Principle steps in the methodology include generating a flow table representing the desired circuit characteristics, coding the flow table with state assignments, generating partitions of the circuits internal states for each input variable, generating a product expression for each partition, and combining the partitions to construct the overall circuit.

Kaplan, "Optimal Integrated Circuit Generation," U.S.

Pat. No. 5,237,513 (1993) describes a method for optimal generation of integrated circuits. The method generates an integrated circuit structure necessary to perform a specific function by separately developing a set of combinatorial logic gates. The logic gates when combined perform the specified function. The method first breaks down the circuit's Boolean logic expression into a number of multidimensional Boolean spaces, which represent the inputs and outputs of the circuit's function. These spaces are then separately manipulated to generate a corresponding set of paths from which logic transistor networks are formed to provide the overall circuit structure. This results in an integrated circuit having smaller area and possibly faster operation.

McDermith et al., "Partitioning of Boolean Logic Equations into Physical Logic Devices," U.S. Pat. No. 5,140,526 (1992) describes a method and apparatus for partitioning Boolean equations in order that physical logic devices for those equations can be implemented within the user's design constraints. Based on the user-generated cost values, physical constraints and pin directives, the partitioning process 340 of FIG. 3 generates a plurality of possible partitioning solutions for implementation. Such solutions include the actual information necessary to configure or connect devices to generate the desired logical operations.

Poirot et al., "Method and Apparatus for the Design and Fabrication of Integrated Circuits Employing Logic Decomposition Algorithms for the Timing Optimization of Multilevel Logic," U.S. Pat. No. 5,282,148 (1994) describes an apparatus and method of synthesis of integrated circuits wherein logic decomposition is employed to optimize the timing of the circuits multilevel logic. The method realizes a layout for large scale integrated circuits having a plurality of gates after decomposing multiple input gates into a plurality of gate networks having a fewer number of inputs.

BRIEF SUMMARY OF THE INVENTION

The invention is a method for machine design of an asynchronous digital circuit having at least one output comprising the steps of defining asynchronous behavioral specifications for the asynchronous circuit to be designed. A signal transition graph is generated corresponding to the specifications for the asynchronous circuit. A complete state graph is generated from the signal transition graph. A modular state graph is generated from the complete state graph for an output $o_i$. State signal assignments are generated to satisfy predetermined design constraints for the modular state graph. The state signal assignments are propagated upward from the modular state graph to the complete state graph. The steps of generating the signal transition graph, generating the complete state graph, generating the modular state graph, generating the state signal assignments, and propagating the state signals from the modular graph to the complete state graph are repeated for each output of the asynchronous circuit. Expanded state signals are generated in the complete state graphs. A design for logic circuits is generated from the expanded complete state graph meeting each of the predetermined constraints and satisfying the asynchronous behavioral specification. As a result, practical asynchronous digital circuits are machine designed with minimized circuit structure and minimized circuit implementation area.

The step of generating the modular state graph is comprised of the steps of generating an input signal set, $Is(o_i)$, belonging to each output $o_i$ by removing all possible signals from the complete state graph not in the input signal set to decrease design constraint violations.

The step of removing the signals from the complete state graph includes removing noninput-set signal transitions from the complete state graph.

The step of generating the state signal assignments for the modular state graph comprises the step of generating a truth assignment to a SAT formula satisfying the modular state graph representing the predetermined constraints.

In the step of generating the state signal assignments to satisfy the predetermined constraints in the modular state graph, the predetermined constraints comprise constraints of consistent assignment, semimodularity and complete state coding (CSC) constraints.

The step of generating the input signal set for the output $o_i$ comprises the steps of generating a new temporary modular state graph for the output $o_i$. The new temporary modular state graph is generated by merging states connected by $s_i$ transitions for each signal $s_i$ not already in the input signal set. A digital number is generated indicating if the number of CSC conflicts has been reduced. The signal $s_i$ is included in the generated input signal set of the output $o_i$ if the number of CSC conflicts have not been reduced.

The step of generating the state signal assignments in the modular state graph comprises the step of generating a 4-tuple state number for each state in the modular state graph to satisfy the predetermined constraints. In one embodiment the method comprises the step of generating a binary decision diagram from the modular state graph. The shortest path from a root node of the binary decision diagram to a leaf node 1 of the binary decision diagram by choosing a path through the binary decision diagram that assigns binary 0 or 1 values to a minimum number of state variables to reduce implementation area.

The step of propagating state signal assignments of each state in the modular state graph to the complete state graph comprises the step of adding a new state signal assignment value of a state M in the modular state graph to each of the states in the complete state graph that cover the state M in the modular state graph.

The step of generating a design for asynchronous logic circuits comprises the step of generating a logic function in the form of sum of products obtained by generating implied values of signal transition graph outputs in every state of the expanded state graph.

The method further comprises: the step of removing hazards or unwanted glitches in the circuit from the logic function of the output; the step of generating a logic cover of the output logic function by use of a logic minimizer; the step of verifying that the logic cover of the output logic function satisfies the asynchronous behavioral specifications; the step of generating a map of a logic description corresponding to the asynchronous behavioral specifications based on the logic cover; the step of implementing the logic map in an integrated circuit layout according to a selected cell library.

The invention is also characterized as an apparatus for machine generating asynchronous circuit designs comprising a structural preprocessor for partitioning a large state graph into a plurality of smaller state graphs, and a SAT solver for generating state signal assignments to satisfy a plurality of predetermined constraints for each of the smaller state graphs. A synthesizer combines output from the SAT solver for each of the smaller state graphs in an expanded complete state graph.

The apparatus further comprises a hazard remover for removing dynamic and static logic hazards from the expanded state graph generated by the synthesizer. The apparatus further comprises a Boolean minimizer for minimizing Boolean structure from a Boolean function output. The Boolean minimizer is coupled to the hazard remover to minimize hazard-free Boolean output derived from the synthesizer through the hazard remover. An asynchronous technology mapper generates an integrated circuit layout from the corresponding logic equations.

One embodiment of the SAT solver is a binary decision diagram SAT solver. The BDD SAT solver maximizes don't care sets of functions implementing signal transition graph output signals from the preprocessor to reduce implementation area.

The invention may be better visualized by now turning to the following drawings wherein like elements are referenced by like numerals.

BRIEF DESCRIPTION OF THE DRAWINGS

FIG. 1b is a signal transition graph (STG) derived from the example of FIG. 1a.

FIG. 2b is a symbolic diagram of the data transceiver whose timing diagram is FIG. 2a.

FIG. 3b is the state encoding of the state graph of FIG. 3a.

FIG. 4b is the state graph of the STG of FIG. 4a.

FIG. 6b is the modular state graph derived from the state graph of FIG. 6a.

FIG. 11b is the state graph of the STG of FIG. 11a.

The invention and its various embodiments may now be understood as illustrated in connection with the above drawings by considering the following detailed description of the illustrated embodiments.

DETAILED DESCRIPTION OF THE PREFERRED EMBODIMENTS

A modular approach for the synthesis of asynchronous circuits for general signal transition graphs (STG) specifications involves the partitioning of a large STG into smaller and more manageable modules, thereby significantly reducing the number of design complexity. As a result, large size specifications can be synthesized in a very short time. The modular partitioning methodology of the invention achieves many orders of magnitudes of performance improvement in terms of design computing time and reduction of chip area used for implementation.

A machine methodology for designing asynchronous circuits utilizes a modular approach for the synthesis of asynchronous circuits from signal transition graphs, partitions the signal transition graph into a number of simpler and more manageable modules. Each modular graph is then individually solved. The results of the small graphs are then integrated together to provide a solution to the asynchronous circuit design problem as defined by a given asynchronous behavioral specification. A satisfiability solver for signal transistion graph constraints, utilizing a binary decision diagram, is incorporated in one embodiment which is comprised of a structural SAT formula preprocessor and a complete, incremental SAT processor which is specifically designed to find an optimal solution. The preprocessor compresses a large size SAT formula representing a circuit into a number of smaller SAT formulas. Each small size SAT formula is then solved by the BDD SAT processor. The results of these subsolutions are then integrated together to contribute to the solution of the original larger design problem.

Figure 1A:
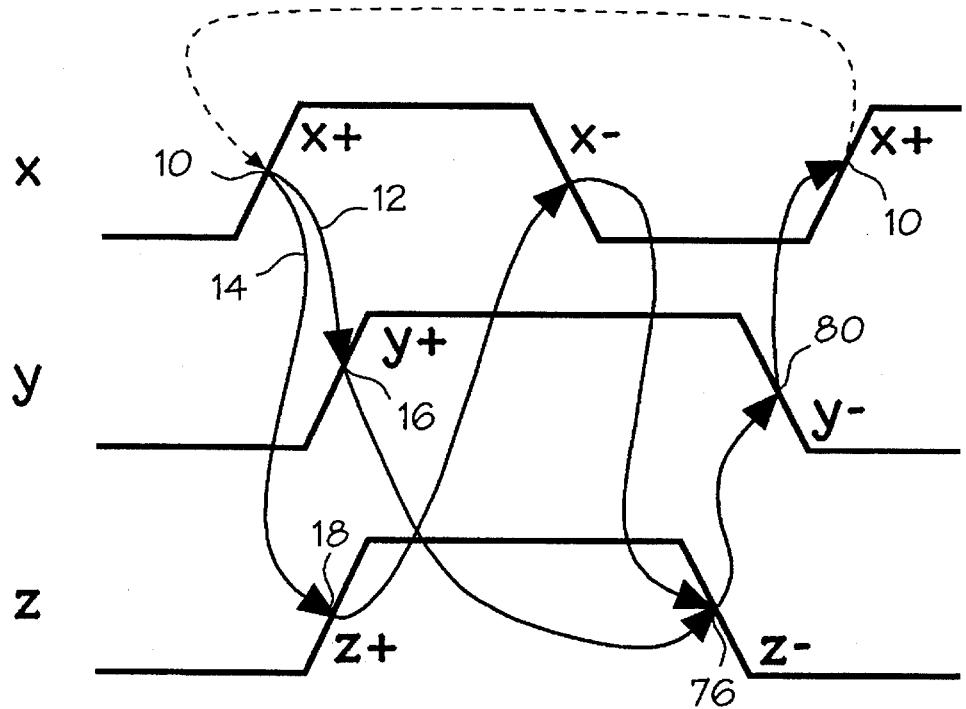
FIG. 1a is a conventional timing diagram of an illustrated example having three signals, x, y and z.

Event-based graphical specifications or signal transition graphs (STG) are based on Petri nets. See, for example, Murata, "Petri Nets: Properties, Analysis and Applications," Proc. of IEEE, 77(4):541–80 (1989). FIG. 1a shows a simple example of a conventional timing diagram. Three signals, x, y and z, having rising and falling edges denoted by the plus or minus signs following the signal designation, are assumed to be required by the illustrated application to have a certain logical relationship between their rising and falling edges as indicated by the arrows in FIG. 1a. What is shown in FIG. 1a is a simple example and the signal relationships may be entirely arbitrary and are normally substantially more complex than that depicted in FIG. 1a.

Figure 1B:
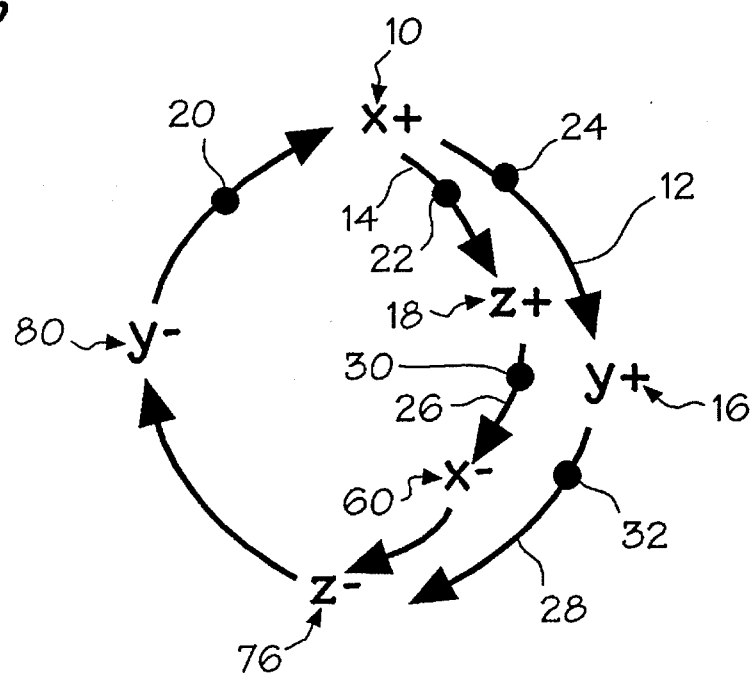

FIG. 1b illustrates a signal transition graph STG derived from the example of FIG. 1a. The various states of the signal or their rising and falling edges, denoted by x+, x−, y+, y−, z+ and z−, are illustrated in the STG of FIG. 1b with their logical connections illustrated by the connecting arrows drawn between them. For example, in FIG. 1a, x+ signal transitions 10 is connected through arrows 12 and 14 to y+ signal transition 16 and z+ signal transition 18. The same arrows and signal transitions are indicated by the same reference numerals in FIG. 1b. The signal transition graph of FIG. 1b graphically describes the behavior of the asynchronous interface circuit having the timing wave diagram of FIG. 1a.

Assume the circuit of the example is in the state represented by token 20 in FIG. 1b. As the state of the circuit moves from the position symbolized by token 20 to the transition point indicated by x+ signal transition 10, the next state of the circuit will be represented by the hollow tokens 22 and 24 on arrows 14 and 12 respectively. Transition 10 is said to be enabled when the circuit token is at position 20 and then fired when the circuit state has changed such that the circuit tokens are at positions 22 and 24. In this state, both z+ signal transistion 18 and y+ signal transisiton 16 are enabled. This is an example of concurrency or parallelism, two outputs enabled concurrently.

Sequencing or causality is illustrated in FIG. 1b by the next circuit state in which tokens 22 and 24 enable z+ transition 18 and y+ transition 16 so that these transitions are fired, leaving the circuit state denoted by tokens in positions 30 and 32, respectively. The transition occurrence through x+ transition 10 always precedes the transition occurrences through z+ and y+ transitions 16 and 18. This is an example of sequencing among the transitions.

Figure 2A:
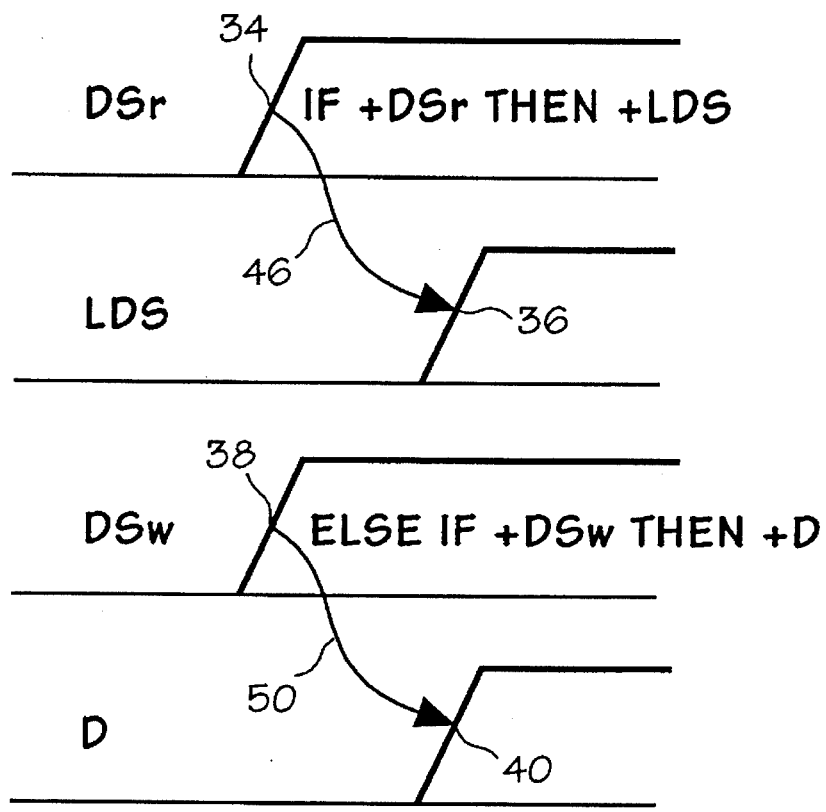
FIG. 2a is a conventional timing diagram representing a logic relationship in which a decision or choice must be made.
Figure 2B:
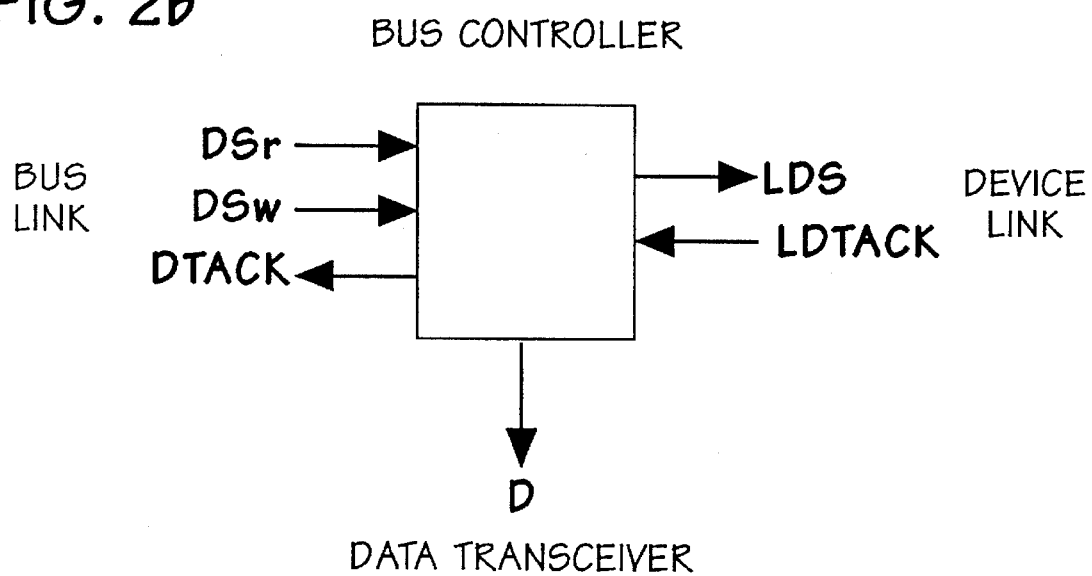
Figure 2C:
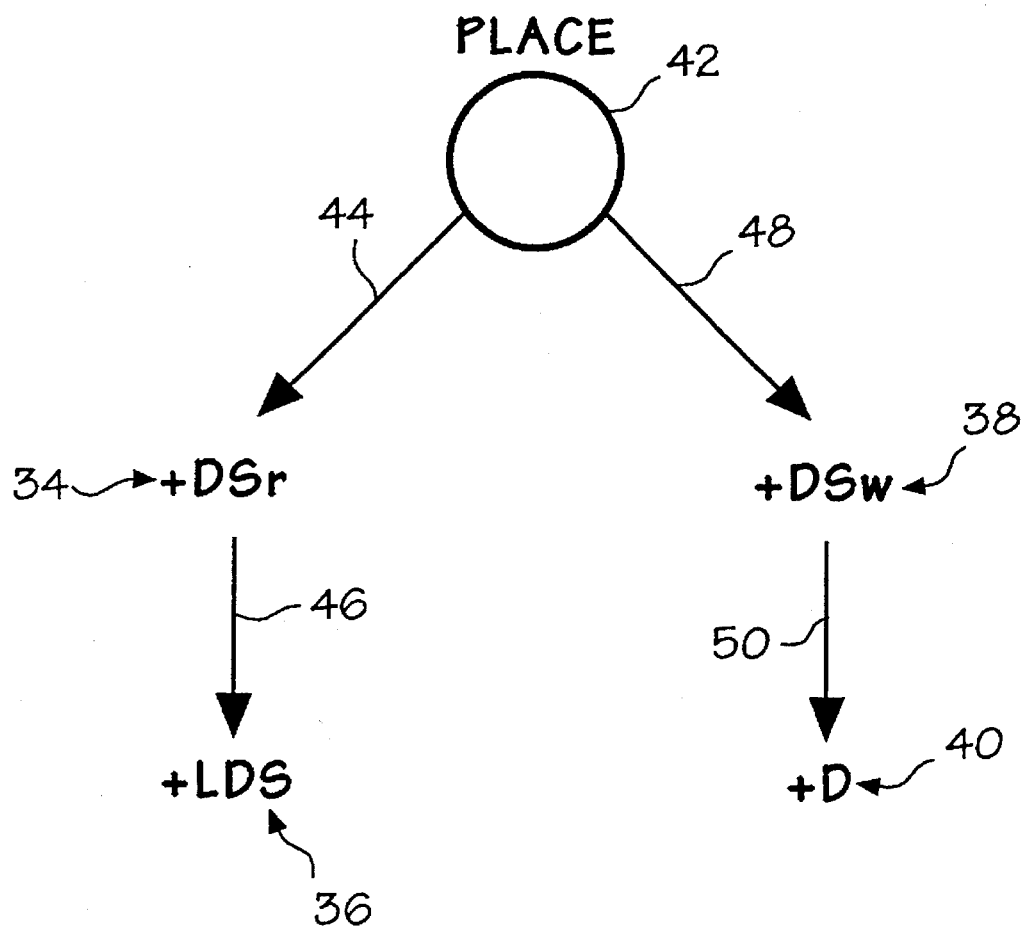
FIG. 2c is the signal transition graph corresponding to the timing diagram of FIG. 2a and the circuit of FIG. 2b.

FIG. 2a illustrates a conventional timing diagram in which a decision or choice must be made. The signal DSR has a positive going edge 34. If DSR is positive going, then the signal LDS is to have a positive edge 36. Otherwise, if the signal DSW has a positive going edge 38, then the signal D is to have a positive edge 40. The conditional logic timing diagram of FIG. 2a could, for example, be implemented in a bus controller, diagrammatically shown in FIG. 2b, which is a data transceiver. The timing diagram of FIG. 2a for the circuit of FIG. 2b is translated into the signal transition graph shown in FIG. 2c. The decision is made at a node 42 which is defined as a place. If there is a +DSr transition 34 for the signal DSR, then the transition occurrence will follow line 44, and then in sequence on line 46 to +LDS transition 36. Otherwise, the signal state will follow line 48 to +DSw transition 38, and thence on line 50 to +D transition 40 as derived from FIG. 2a.

To derive an asynchronous circuit design from a signal transition graph, the STG specifications must satisfy liveness, boundedness and complete state coding (CSC) constraints. In approximate terms, liveness implies the absence of deadlocks in the logic circuit. Boundedness means that the system is finite. Complete state coding constraints means that the signal assignments specified in the signal transition graph completely define the circuit states. Complete state coding is the most stringent requirement on STG specifications. In general, STG specifications that describe asynchronous circuits will not satisfy complete state coding constraints. The original signal transition graph must be transformed in order to satisfy these constraints.

Figure 3A:
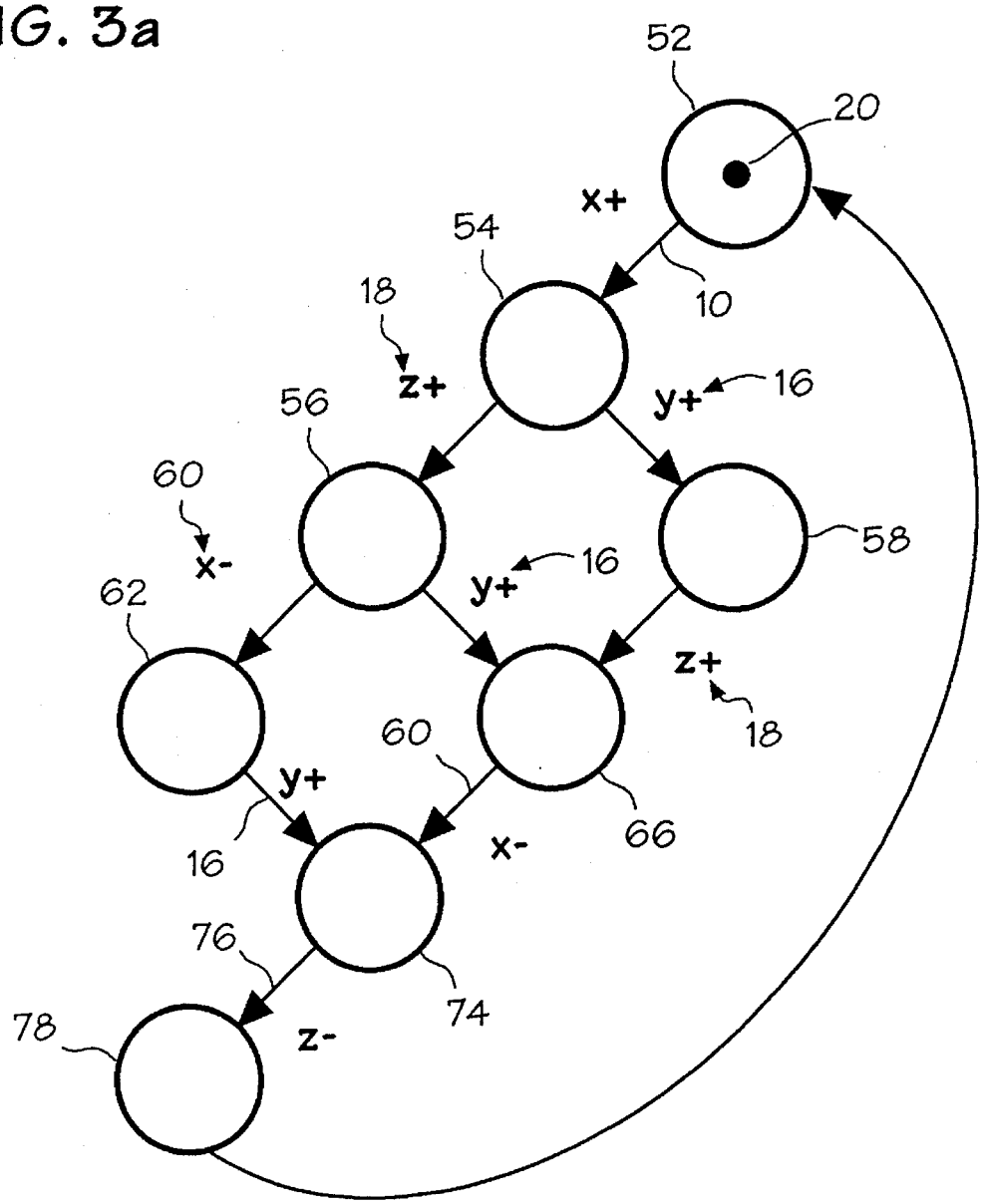
FIG. 3a is a state graph corresponding to the signal transition graph of FIG. 1b.

According to the present invention, the signal transition graph is first partitioned to a number of simpler and more manageable modules. Each modular state transitions graph is then individually solved. The results of these small graphs are then integrated together to provide a solution to the problem. By partitioning the signal transition graph into smaller modules, the problem of solving very large Boolean formulas is avoided. The synthesis approach of the invention is also applicable to general signal transition graphs without limitation to concurrency only or to safe free-choice Petri nets. The computing time, as will be seen below, is many magnitudes or order better than the prior art and realizes a solution in silicon with the reduced amount of implementation area. To derive a logic circuit from the signal transition graph, it must be transformed into a state graph. FIG. 3a is the state graph corresponding to the signal transition graph of FIG. 1b. The state graph is a finite automaton that represents all the states of the circuit. The state graph in FIG. 3a captures all the possible transition sequences in the signal transition graph. The state graph of FIG. 3a is derived from the signal transition graph of FIG. 1b by exhaustively generating all possible markings, that is states of the signal transition graph. A marking is a collection of places corresponding to local conditions which hold at a particular moment. A marking is graphically represented by the dots or tokens in the STG.

For example, with the state token 20 beginning at state 52, state 54 is reached through x+ transition 10, the first rising waveform 10 in FIG. 1a. From state 54, either of two things can then happen in the illustrated example. Either the circuit moves through z+ transition 18 to state 56, or through y+ transition 16 to state 58. If the circuit is in state 56, y+ transition 16 may still then logically occur taking the circuit to state 66, or x− transition 60 may occur bringing the circuit to state 62. If the circuit was in the state 58 with the x+ transition 10 and y+ transition 16 occurring, it is then possible that the z+ transition 18 could have occurred, bringing the circuit to state 66. Once transitions 10, 16 and 18 have all occurred, it is possible that the x− transition 60 may occur, bringing the circuit to state 74. However, if the circuit were in state 62 with transitions 10, 18 and 60 having occurred, it is still possible that y+ transition 16 could have occurred, bringing the circuit to state 74. Once the transitions 10, 16, 18 and 60 have all occurred, z− transition 76 may occur, bringing the circuit to state 78. Thereafter, the y− transition 80 may occur, bringing the circuit back to state 52. The z− transition 76 cannot occur from state 62 since the signal transition graph of FIG. 1b requires coincidence of the y+ transition 16 and x− transition 60 to fire the z− transition 76.

The state graph of FIG. 3a can then be mapped into a speed independent asynchronous logic circuit by deriving the state code assignments for each of the states of the circuit from the values of the signal transition graph signals. Such state encoding is made subject to or represented by the consistent state assignment constraint discussed below.

Figure 3C:
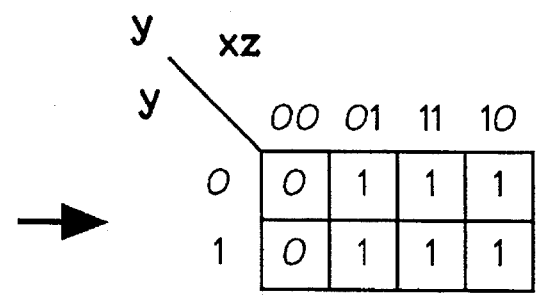
FIG. 3c is the logic derivation table derived from the encoded state graph of FIG. 3b.
Figure 3B:
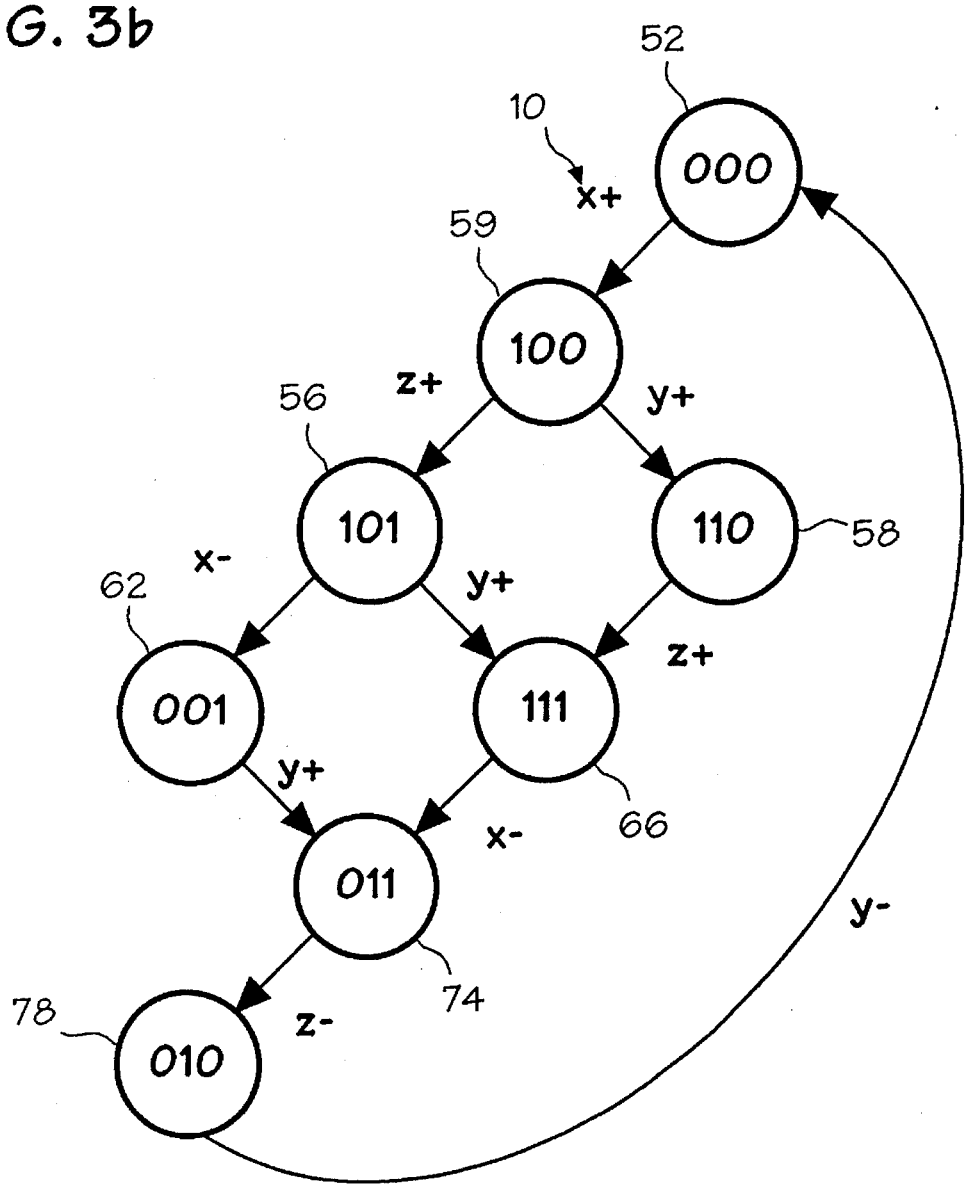

FIG. 3b illustrates the state encoding of the state graph of FIG. 3a. The state of the signals x, y and z at state 52 is 000 by assumption, i.e. all signals started low in the timing diagram of FIG. 1a. Since the x+ transition 10 has gone from 0 to 1, the state encoding at state 54 is (100). By simply following the signals of the state transition graph, the state encoding for each state can be determined as shown in FIG. 3b. A STG has consistent state assignment means that for the signals $(s_1, s_2, \ldots s_n)$ in the STG a state M in the STG is assigned a binary code $<M(s_1), M(s_2), \ldots M(s_n)>$. If a transition t is enabled in a state M, i.e. $M \rightarrow tM'$, then $t= s_i+$ implies $M(i)=0$ and $M'(i)=1$; $t=s_i-$ implies $M(i)=1$ and $M'(i)=0$.

In any state graph with consistent state assignment, the complete state coding constraint is satisfied by definition if and only if: (1) no two circuit states have the same binary code assignment; and (2) two states having the same binary code enable the same non-input signals, i.e. output or intermediate circuit signals. It can be shown that the complete state coding constraint is the necessary and sufficient constraint to derive the logic circuit functions from the state graph.

To derive then the logic circuit Boolean functions a CSC violation must be corrected by inserting new signals into the state graph in order to distinguish the states which violate the constraint. These new inserted signals are called "state signals." The state signal must satisfy the additional constraint of semimodularity to preserve the circuit behavior. The semimodularity constraint is defined as follows. A transition, t, is semimodular, if and only if transitions t and t' are enabled in a marking M and transition t will still be enabled in a second marking M' which is obtained after firing transition t'. In other words the transitions t and t' are semimodular if and only if after both being enabled and one of them is fired, the other is still enabled. The inserted new state signals which will correct violations of the CSC constraints must be made so that they are semimodular.

In the very simple example of FIG. 3b, note that the state coding happens to be unique. There are no two states with the same state code. In this situation, there is not need for state signals to be inserted and the logic derivation can be quickly worked out as shown in FIG. 3c where the output y is derived from the state encoding of the signal pair x and z. The implied value of output y inserted into the table of FIG. 3c in a state, S, is determined by the rule that if output y is enabled in state, S, then its implied value is a complement of its present value, otherwise, the present value is taken. For example, in state 52, xyz have the value (000) and y is not enabled, therefore, the implied value of output y is its present value or 0 as in state 54 where y=0. A 0 is then stated in the table entry corresponding to the state (000). In state 62, xyz has the value (001) and y is an enabled transition since it fires in reaching state 74, therefore, the implied output is its complement of the value in state 62 or 1. Similarly, 1 is entered in the upper row of the truth table FIG. 3c corresponding to states 56 and 54. In state 58 with state encoding (110) where xz is 10 y is not enabled so the value of y, which is 1 in state 58, is the entry in the truth table. In the same manner, states 66 and 74 provide the remaining ones in the truth table of FIG. 3c. In state 78 with the state encoding (010) y fires, therefore, the implied output of y is a complement of its value in state 78 or 0, thereby $o_i$ is stated in the table entry corresponding to state (010) in FIG. 3c.

Figure 3D:
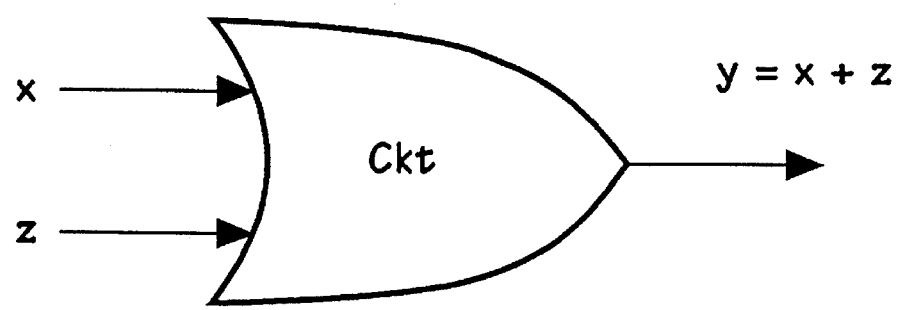
FIG. 3d is the logic circuit implementation of the logic derivation table of FIG. 3c.

Given the truth table of FIG. 3c, the logic circuit of FIG. 3d may then be written in Boolean form, namely for the OR gate y=x+z.

Figure 4A:
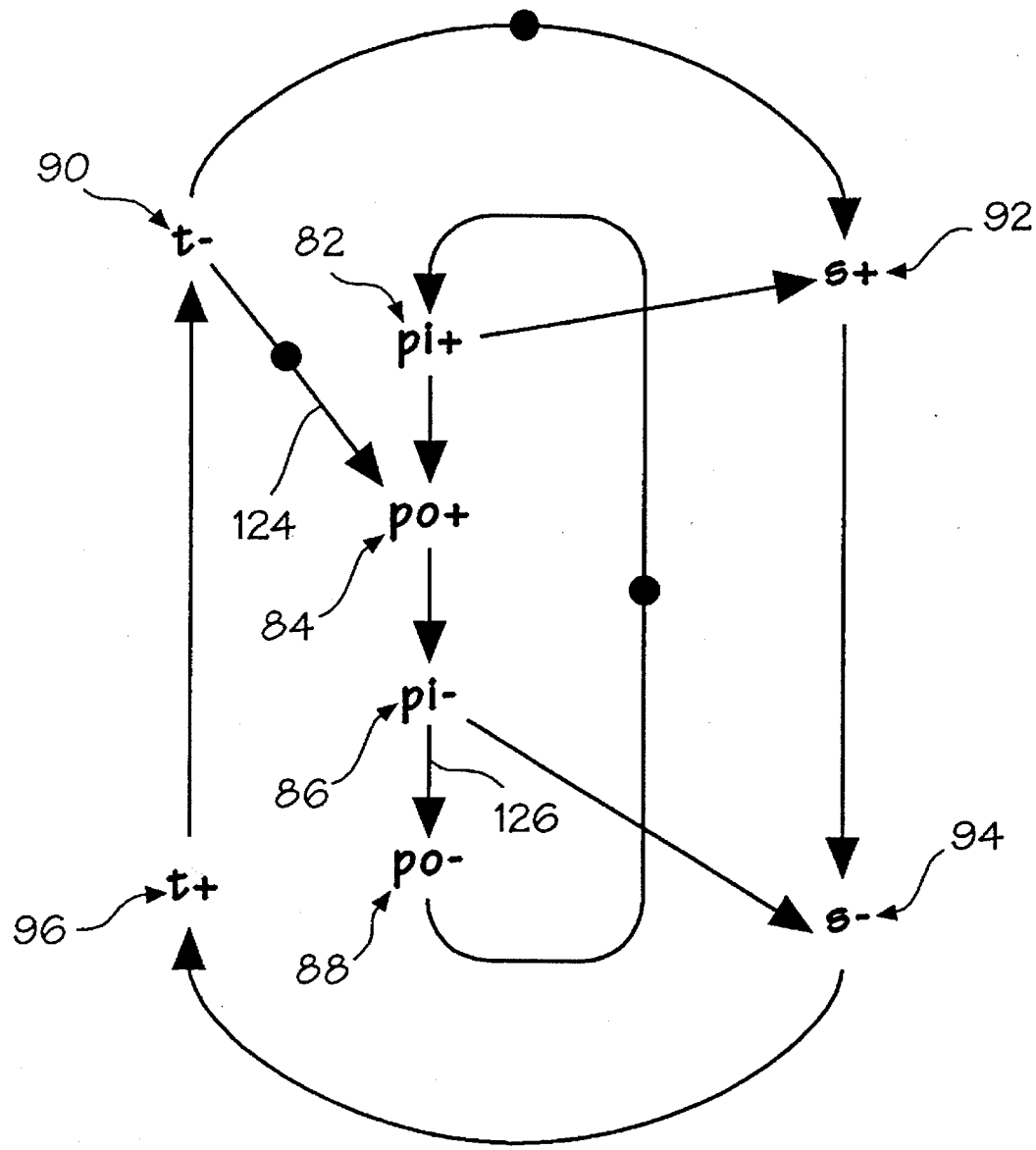
FIG. 4a is a signal transition graph (STG) for a circuit having the inputs pi and t and the outputs po and s.

Consider a more realistic, albeit simple example, wherein unique state codes will not occur in the state encoding and state signals must therefore be entered to correct CSC violations. Consider the signal transition graph of FIG. 4a for a circuit having the inputs pi and t and the outputs po and s. The signal transition graph in the example has the pi+ input transition 82 graphed to the po+ output transition 84, then to the pi− input transition 86 to po− output transition 88, and back to pi+ input transition 82. A t− input transition 90 is graphed to an s+ output transition 92, followed by s− output transition 94 and a resetting of a t+ input transition 96. As before, signal transition graph 4a is converted into a state graph shown in FIG. 4b by exhaustively generating all the 18 states of the signal transition graph.

Figure 4B:
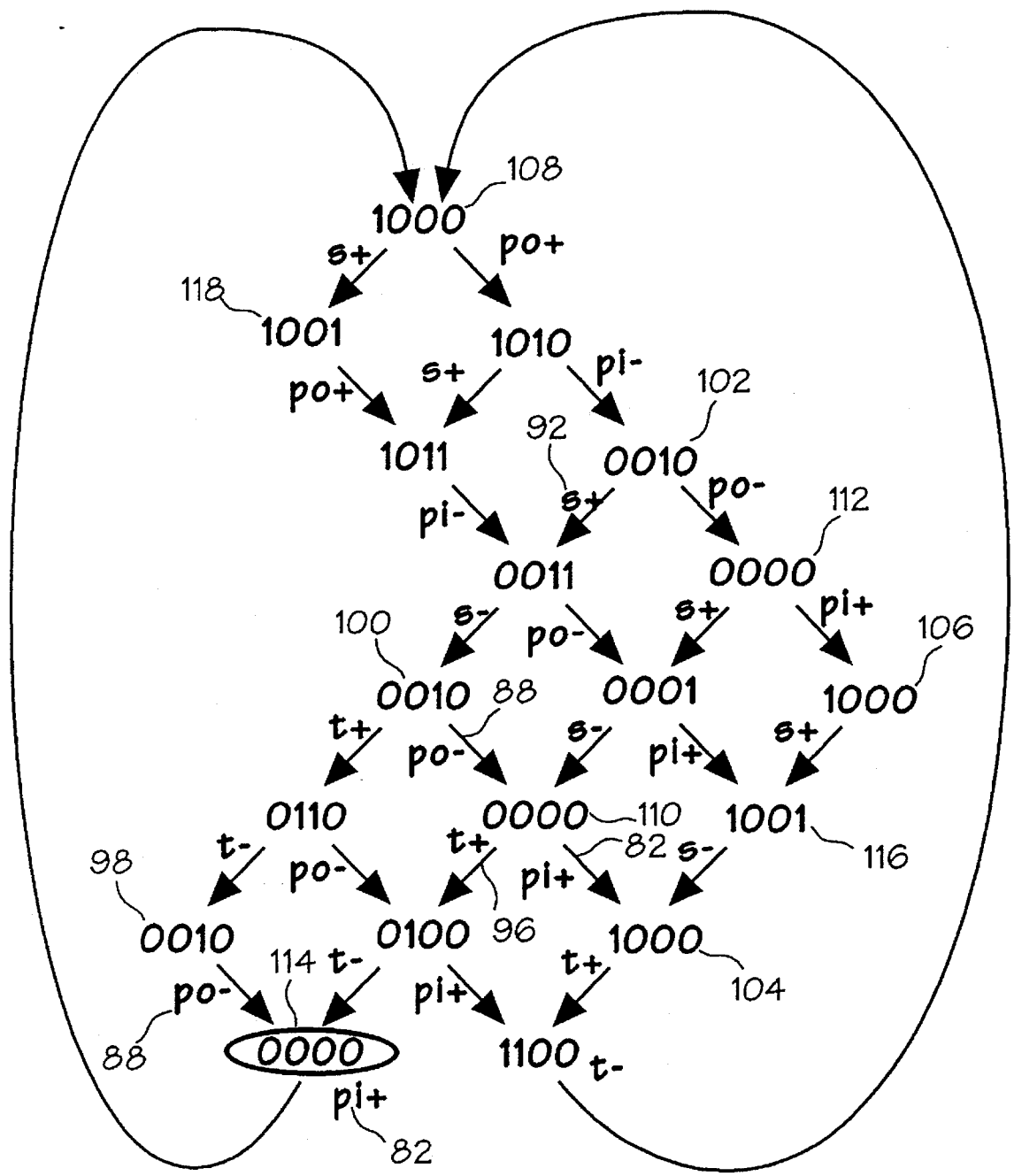

It so happens that the state graph of FIG. 4b contains 10 state pairs with the same state encoding. There is an identical state code (0010) at states 98, 100 and 102 of the variables pi, t, po, and s, an identical state code (1000) at states 104, 106 and 108, an identical state code (0000) at states 110, 112 and 114, and an identical state code (1001) at states 116 and 118. The output variable, the po− transition 88, is enabled in states 98 and 100 which both have the state coding (0010). These two states do not violate the CSC constraint, namely the two states do not have the same binary code assignment and enable the same non-input signals since state 100 also enables the t+ transition. Similarly, the states or states 110 and 114 do not violate the CSC constraint because both states enable only input signals, namely pi+ transition 82 and t+ transition 96.

This leaves 8 CSC constraints violated in the state graph of example of FIG. 4b, namely states 98 and 102 since state 102 has an s+ transition output 92, and for similar reasons, states <100 and 102>, <104 and 106>, <104 and 108>, <106 and 108>, <110 and 112>, <112 and 114>, <116 and 118> violate the CSC constraint.

Since the maximum number of states with the same binary state coding (1000) in this example is three, it can be shown mathematically that the lower integer bound on the number of state signals which must be inserted is $[\log_2(3)]= 2$. Therefore, using conventional SAT circuit model solutions (below) in order to keep consistent state assignments and state graph semimodularity as defined above, two state signals must be introduced to satisfy the CSC constraints.

In general the SAT-circuit model has N states and $N[\log_2(\text{Max}_{csc})]$ state variables. The number of states variables $m=[\log_2(\text{Max}_{csc})]$ is the lower bound on the number of state signals which must be introduced to satisfy the CSC constraint where $\text{Max}_{csc}$ denotes the maximum number of states in the state graph which has the same state encoding. The complexity of the extracted Boolean formula from the state graph depends upon the number of states, N, the number of concurrent transitions and the number of CSC constraints. If a state graph has N states and E transitions, the resulting Boolean formula will have $m(c_1 E + c_2 N_{ct} + N_{usc} c_3^m + N_{csc} c_4^m)$ clauses and $2 \times N \times m$ variables where:

m is the number of state signals required to satisfy the CSC constrains;

$N_{ct}$ is the number of concurrent transitions;

$N_{usc}$ is the number of state pairs having the same binary coding;

$N_{csc}$ is the number of CSC constraints; and $c_1, c_2, c_3$ and $c_4$ are constants.

The satisfiability (SAT) problem has three components:

(1) the set of m variables, $x_1, x_2 \ldots x_q$;

(2) a set of literals which are the variables or their negation; and (3) a set of r distinct clauses, $C_1, C_2 \ldots C_r$, where each clause consists only of literals combined by logical ORs.

The goal of the satisfiability problem is to determine whether there exists an assignment of truth values to the variables which will make the conjunctive normal form formula, which is comprised of the logical product of the clauses, satisfiable.

The SAT-circuit formula represents or incorporates the CSC, consistent state assignment and semimodularity constraints. If the formula is unsatisfiable, then a new state signal is added. This in turn generates a new SAT formula. The truth assignment satisfying the above constraints is then deemed a feasible solution to the SAT-circuit design problem.

Figure 4C:
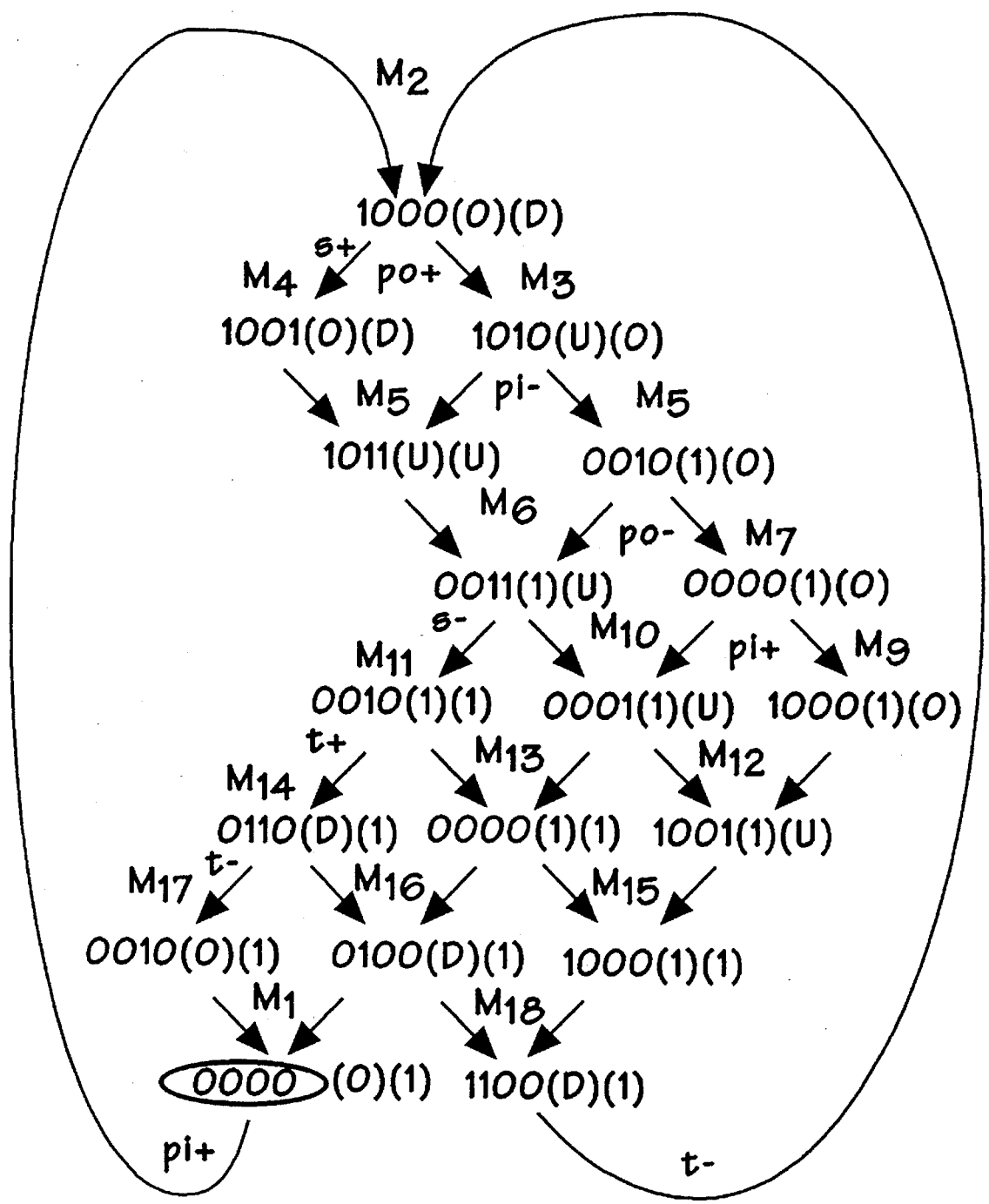
FIG. 4c is the state graph of FIG. 4b after two state variables have been added to correct CSC violations.

Therefore, according to this methodology, two state variables are assigned to each of the states in FIG. 4b, corresponding to the two added state signals. The new state variables are not binary but are 4-tuple having one of the values (0, 1, UP, DOWN). FIG. 4c illustrates the state diagram of FIG. 4b after these two additional state variables have been added to distinguish each of the states uniquely from each other. The constraints can be formulated as Boolean clauses on the pairs of binary variables added to each of the states in the state graph. In the illustrated example, this will require 72 binary variables in the Boolean constraint formula, namely for the two added 4-tuple state signals at each state there will be four binary values for each state in the state graph. Since there are 18 states in FIG. 4b, this requires 72 binary variables in the Boolean constraint formula. The SAT boolean formula if written out would then require 1,012 clauses, 608 clauses for CSC constraints, 224 clauses for consistent state assignment constraints and 180 clauses for semimodularity constraints. The final assignment of the state values will resolve all the CSC conflicts in the state graph in FIG. 4c. For example, the CSC conflict between states 108 and 106 in FIG. 4b is resolved by the state variables 0 and 1 in the reformulated states (10000D) and (100010). The size of the Boolean formula from which the logic must be derived is unwieldy and in many cases not susceptible to practical machine solution.

Consider now in contrast how the modular approach of the invention would establish a state graph for the same circuit. The constraint satisfaction problem (CSP) has three components: variables, state values and constraints. The goal is to find an assignment of values to the variables such that the constraints are satisfied. In a modular constraint graph model, the complete graph is partitioned into smaller and simpler graphs. Various local smaller graphs can be manipulated individually. An integration mechanism is discussed below that fits these local modules together into a global network. Modularity then means the ability of the present methodology to decompose a complex system into easily understood modules.

Another important aspect of modularity is the constraints. The modularity of constraints refers to the ability of the methodology to enable complex information to be represented in terms of modules of local information. Each individual module of constraint relations may be handled separately. However, the representation of the invention differs with respect to how a module of local information communicates with another one. In the present invention, the assignment information in each local module is communicated to other local graphs as well as to the global graph. It is this interaction which allows a complete solution to be built from solutions from individual local modules.

In the modular partitioning approach of the invention, the state graph is first partitioned into a number of simpler and manageable state graphs. Each modular graph is then solved individually. The results of these small graphs are integrated together to contribute to the solution of the given problem.

Partitioning a large state graph into smaller state graphs has several unique advantages. First, it significantly reduces the number of constraints by orders of magnitude. For example, in one signal transition graph benchmark problem, the direct SAT formulation described in previous work in connection with FIGS. 4a–4c requires a solution of a very large SAT formula with 35,386 clauses. In comparison, the modular partitioning approach of the invention requires only three very small formulas, two of which have 954 clauses and one which has 85 clauses.

Second, the partitioning methodology leads to reduction in the two-level implementation area. This is due to a good starting point for the logic minimizer and reduced interaction among circuit signals.

Third, the partitioning approach of the invention simplifies circuit verification.

Figure 5A:
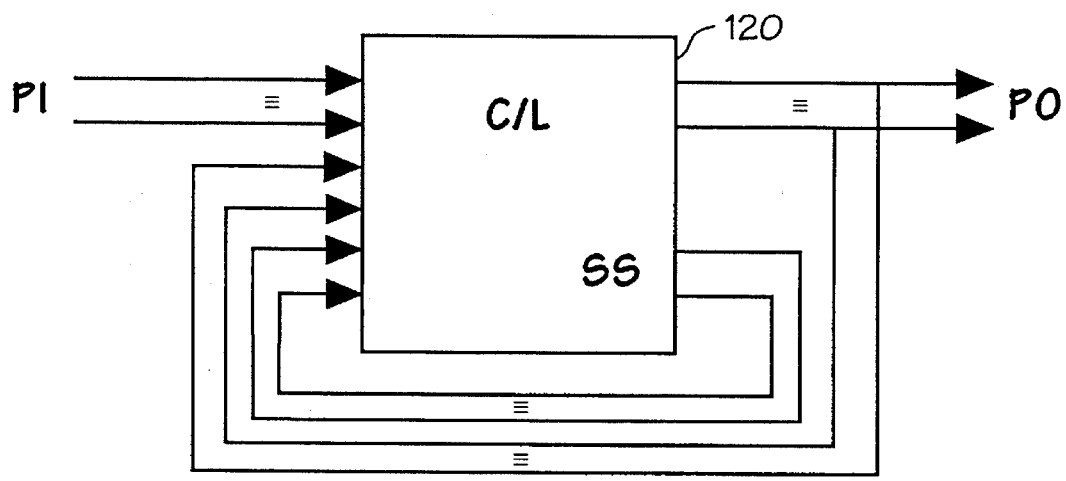
FIG. 5a is an abstract representation of the structure of the asynchronous circuit which must be designed.
Figure 5B:
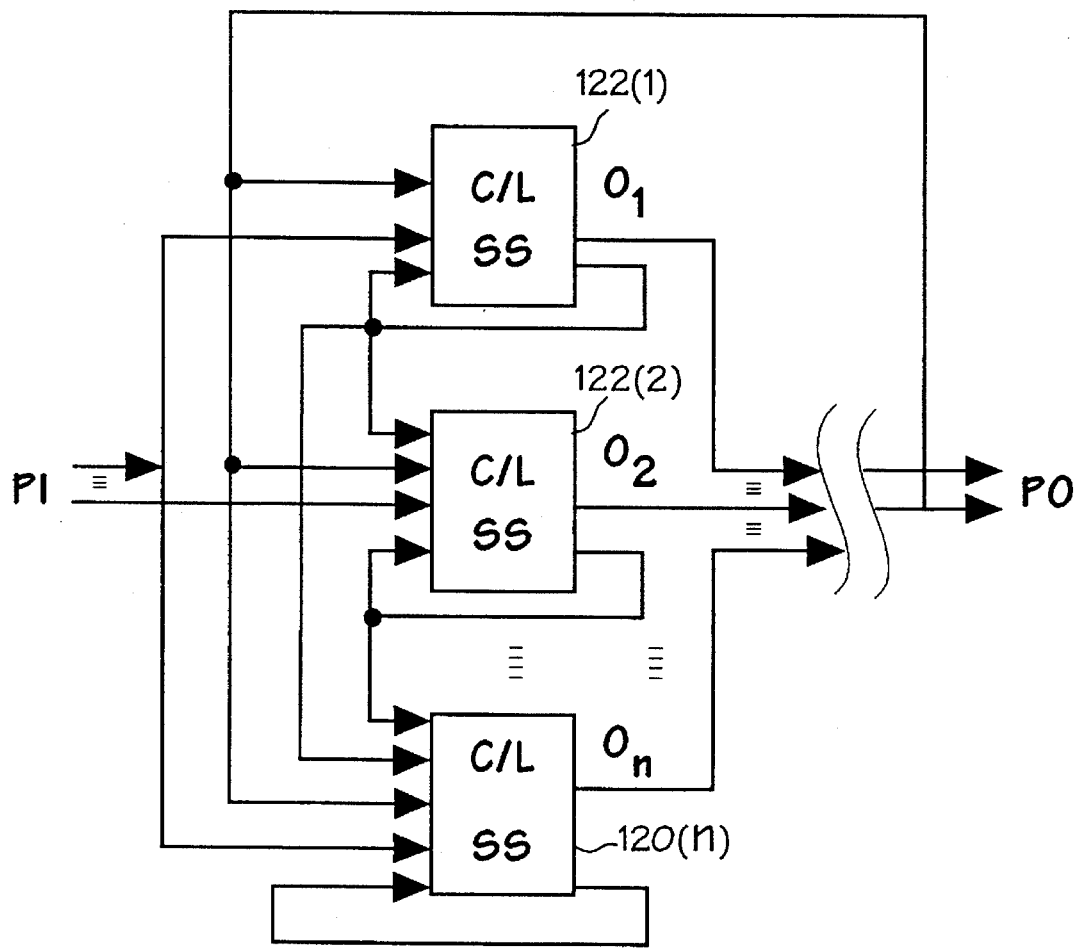
FIG. 5b is an abstract representation of how the methodology of the invention partitions the asynchronous circuit design to satisfy the circuit specifications and constraints.

The modular approach is illustrated very abstractly in connection with FIGS. 5a and 5b. The first step is to determine the input signal set, $Is(o_i)$, which belongs to the output signal $o_i$ by removing all signals, including state signals, possible from the complete state graph to decrease the CSC conflicts. Second, a smaller modular state graph is derived from the complete graph for the input set $Is(o_i)$. Third, the new state signals are found and their assignment (0, 1, UP, DOWN) to the states of the smaller modular state graph are found by determining the truth assignment to the SAT formula satisfying the consistent assignment, semimodularity and CSC constraints. Fourth, the truth assignments to the new state signals are propagated from the smaller modular state graph to the complete graph. Fifth, each of the above steps are then repeated for every output signal.

FIG. 5a represents the complete state graph 120 for an arbitrary, combinatorial logic circuit having primary inputs PI and primary outputs PO with state signals SS. FIG. 5b illustrates the results of partitioning the state graph of FIG. 5a as suggested above for a single output signal PO. The input signal set is identified here symbolically indicated as a single signal PI and the larger state graph 120 is partitioned into smaller state graphs 122(1) through 122(n).

The modular synthesis method does not guarantee a minimum number of state signals used to satisfy the CSC constraints. The number of state signals used to synthesize the signal transition graph may increase due to the integration of the local solutions of the modular state graphs 122(i). However, in practice, a global optimal solution of most asynchronous benchmark circuits has been achieved. In some benchmarks where more state signals are required, the implementation area of the synthesized circuit is less than the area required to implement the state graph with minimum number of state signals.

The input signal set belonging to an output is then used to derive a modular state graph. The modular state graph is generated by labeling all the transitions of the input signal set as silent transitions in the complete state graph. The values of the input set signals are removed from the state codes in the complete state graph. Then the states connected by the silent transitions are merged together.

Consider now the general methodology in detail. The first step is determining the input signal set. The input signal set belonging to an output, $o_i$, is defined as the minimum number of signal transition graphs signals required to implement its logic circuit. The input signal set consists of an immediate input set and other signal transition graph signals required to satisfy the CSC constraints. The immediate input set of the output, $o_i$, is determined by the STG signals whose transitions immediately precede a positive or negative transition of the output, $o_i$. A signal, $s_i$, is in the immediate input set if and only if the signal transition graph specifies a direct causal relationship between the transitions $s_i$ and $o_i$. To minimize CSC conflicts, the remaining signals in the input set are determined by removing STG signals from the complete state graph as much as possible. A signal, $s_i$, not including the output $o_i$, which is not in the immediate input set, can be removed from the state graph if it does not increase the number of CSC conflicts and the state signal is required to resolve those conflicts. A signal is removed from the state graph by labeling all of its transitions as a silent transition, epsilon. The removal of the STG signal implies that it is not required to implement the logic circuit corresponding to the output $o_i$. A signal, $s_i$, cannot be removed from the state graph if a state signal, $n_k$, assigns an UP value to a state $M_i$ and a DOWN value to a state $M_j$ in the transition between the two or vice versa. This assures that the modular state graph 122(i) has a well-defined assignment for the state signal, $n_k$. The derivation of the state variable assignment in the modular state graph will be described below. A general methodology for determining the input set is summarized in Table 1 below.

TABLE 1

Inputs: Σ: complete state graph. $o_i$: an output signal.
Output: $I_S(o_i)$: input signal set belonging to output $o_i$.
Variables: $N_{csc}$: number of CSC conflicts. $L_b$: lower bound on number of state signals.
I: immediate input set. $Σ_{temp}$: temporary state graph.
procedure determine_input_set(Σ, oi, $I_S(o_i)$) {
    $N_{csc}$ := number of CSC conflicts in Σ;
    $L_b$ := lower bound on number of state signals in Σ;
    I := immediate input set of output $o_i$;
    $I_S(o_i)$ := immediate input set I;
    for each signal $s_i$ that is not in I∪$o_i$ {
        $Σ_{temp}$ := Σ;
        Merge states connected by ε or $s_i$ transitions in $Σ_{temp}$;
        $N_{csc}^{new}$ := new number of CSC conflicts in $Σ_{temp}$;
        $L_b^{new}$ := new lower bound on number of state signals in $Σ_{temp}$;
        if ($N_{csc}^{new}$ <= $N_{csc}$ and $L_b^{new}$ <= $L_b$) {
            /* signal $s_i$ is not required for the logic function of output $o_i$ */
            $N_{csc}$ := $N_{csc}^{new}$;
            $L_b$ := $L_b^{new}$;
            Label all the transitions of signal $s_i$ as ε transitions;
        }
        else {
            /* add signal $s_i$ to the input set $I_S(o_i)$ */
            $I_S(o_i)$ := $I_S(o_i)$ ∪$s_i$;
        }
    }
    for each state signal $n_i$ in $Σ_{temp}$
        if (removing $n_i$ increases CSC conflicts in $Σ_{temp}$)
            /* add state signal $n_i$ to the input set $I_S(o_i)$ */
            $I_S(o_i)$ := $I_S(o_i)$∪$n_i$;
}

An example will make this clear. Return to the specific illustration of FIG. 4a. There are two primary outputs po and s, and two primary inputs pi and t. The state code of the state graph is (pi, t, po, s). In the signal transition graph of FIG. 4a, two signal transitions, t− transition 90 and pi− transition 86, immediately precede the po+ output transition 84 and PO− output transition 88 denoted by line 124 and 126. Thus, the immediate input set for the output po in the example of FIG. 4a, consists of two signals, pi and t.

To find the rest of the STG signals in the input signal set for po, consider now the state graph of FIG. 4b, which contains the eight CSC conflicts described above. As previously stated, the lower bound on the number of state signals that must be added is two. The STG signal s, (not including the output po), that is not in the immediate set consisting of (pi, t), is removed from the state graph of FIG. 4b, i.e. all the s+ and s− transitions shown within the shaded areas of FIG. 6a. This reduces the number of CSC conflicts to three and reduces the lower bound on the number of state signals to one as illustrated in FIG. 6b. No other STG signals can be removed from the illustrated example since the only remaining signals, not including the output po, are in the immediate input set, (pi, t) of the output po.

Figure 6A:
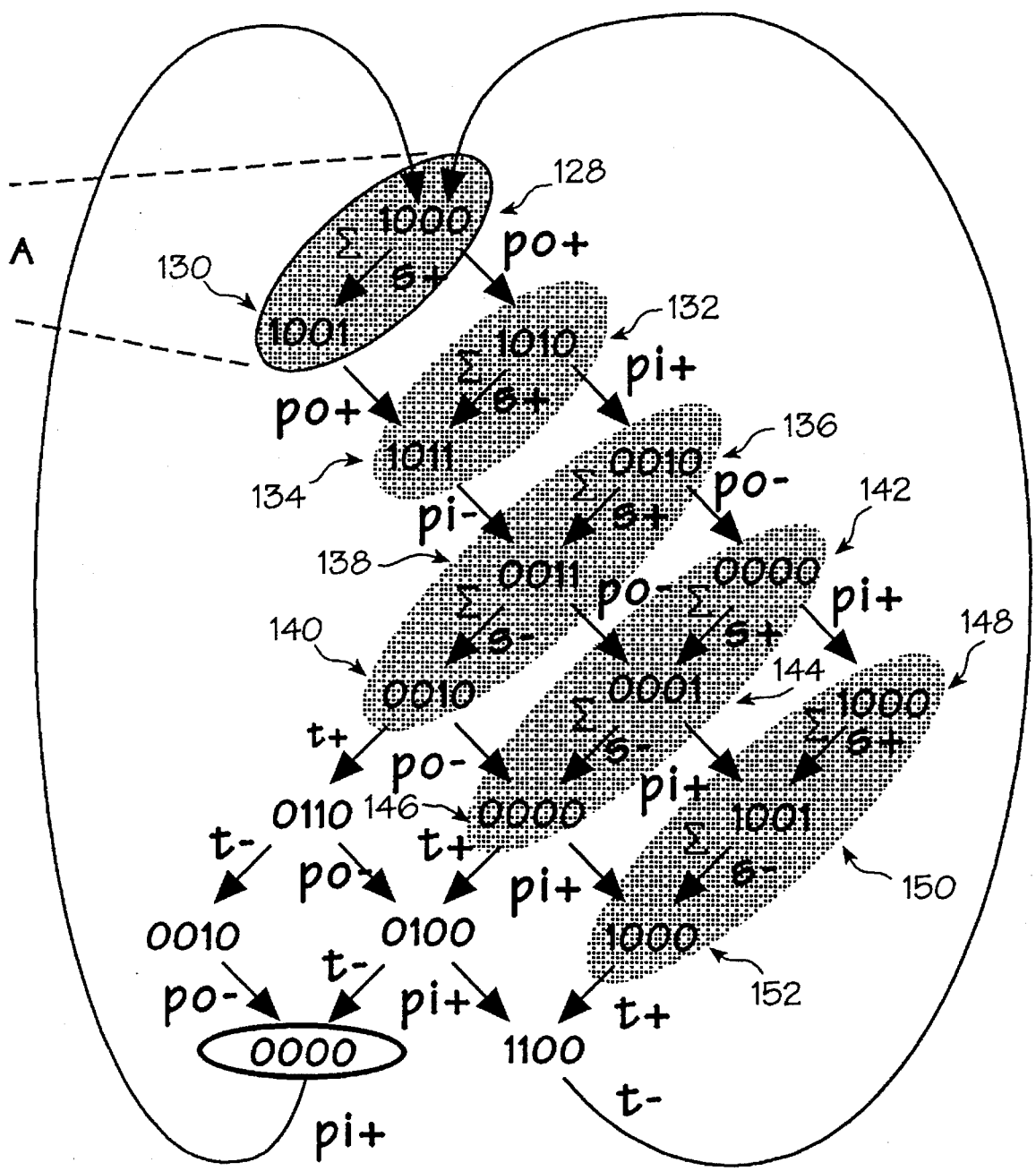
FIG. 6a illustrates the removal of a signal from a STG to produce a partitioned modular state graph.
Figure 6B:
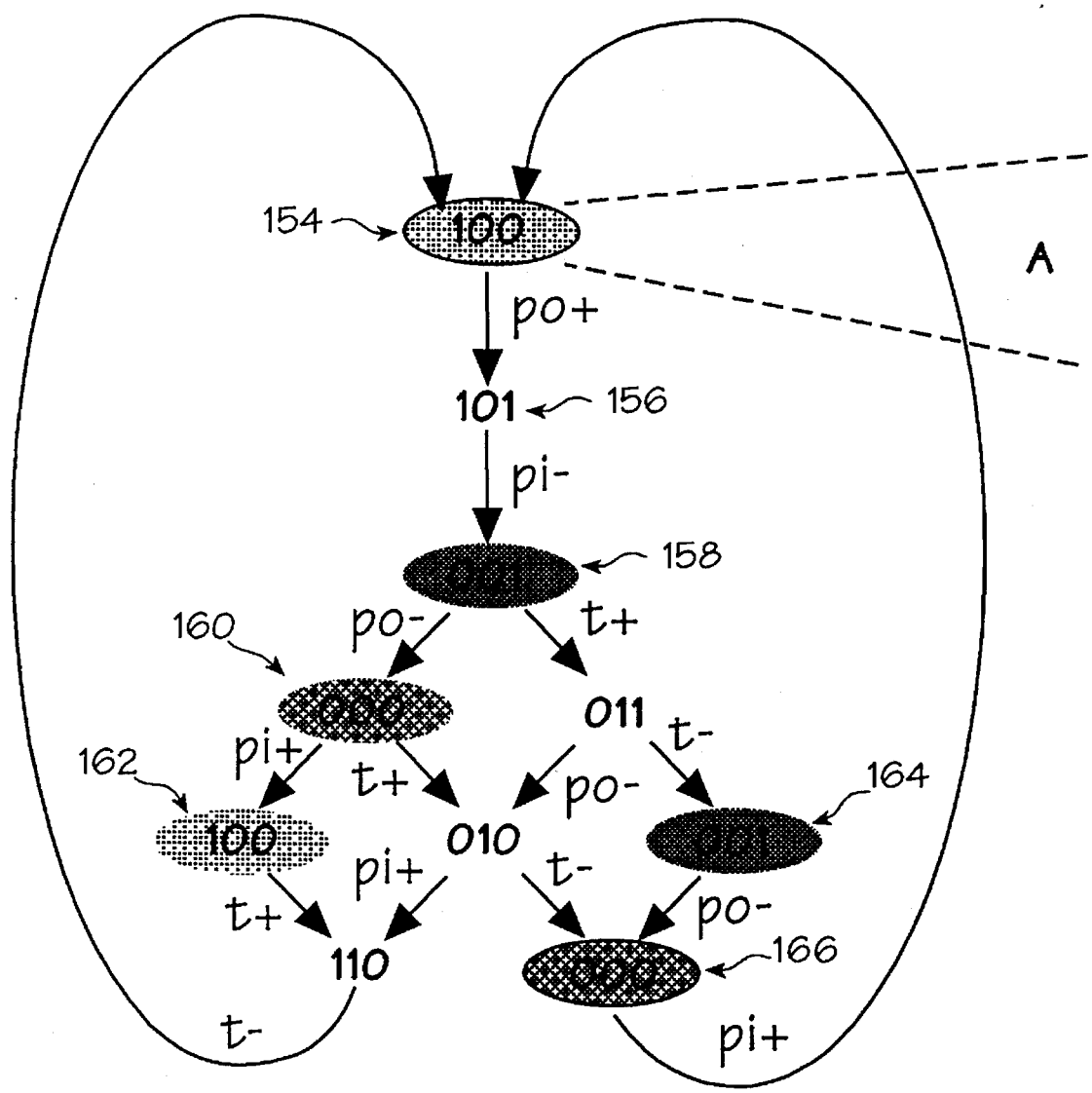
Figure 6B:
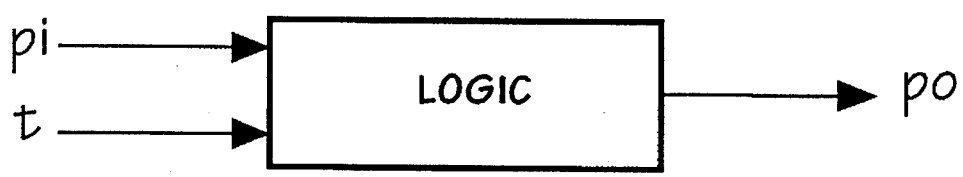

FIG. 6a is a copy of the state graph of FIG. 4b with the s transitions particularly identified. Each of these transitions are labelled by epsilon as being a silent transition. When these transitions are removed from the state graph, a smaller modular state graph is shown as provided in FIG. 6b. The eight CSC conflicts in FIG. 6a are now reduced to three in FIG. 6b, namely states 128 and 130, states 132 and 134, and states 136 and 138. The number of state signals which must now be added to resolve the CSC conflicts is now only one rather than two.

Figure 6C:
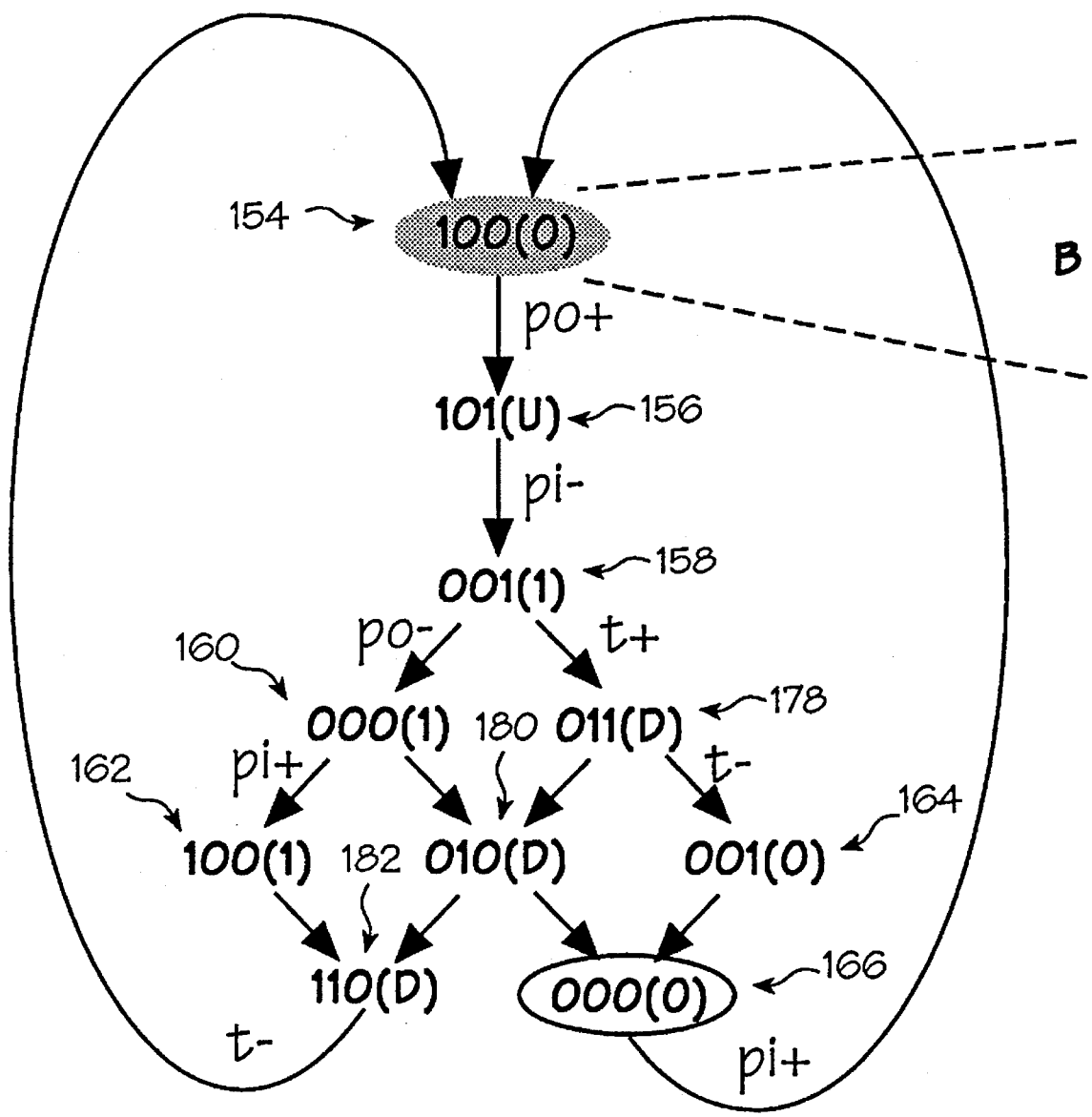
FIG. 6c is the modular state graph of FIG. 6b with a new state signal, $n_1$ added.

As previously described, this state signal, $n_1$, a 4-tuple, can be added to the state graph of FIG. 6b to obtain the state graph of FIG. 6c. In the state graph of FIG. 6c, the input signal set of the output po consists of the signals (pi, t, po) and the input signal set of the output s is (pi, t, po, s, $n_1$) where $n_1$ is the added state signal.

The assignment values of every state signal of the input signal set are propagated to the modular state graph as follows. Consider the state assignments for states $M_i$ and $M_j$ in the complete state graph.

Case 1: If the states $M_i$ and $M_j$ have the same assignment value for the state signal $n_k$, that is $n_{i,k}=n_{j,k}$ then the merged state $M_iM_j$ in the modular state graph will also have the same assignment value for the state signal $n_k$. This is illustrated in boxes a–d in Table 2 below.

TABLE 2

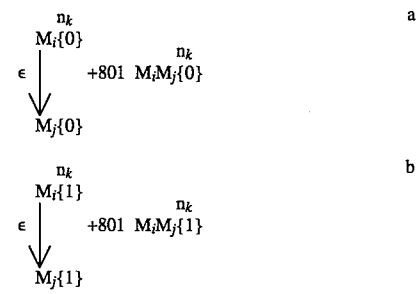

TABLE 2-continued

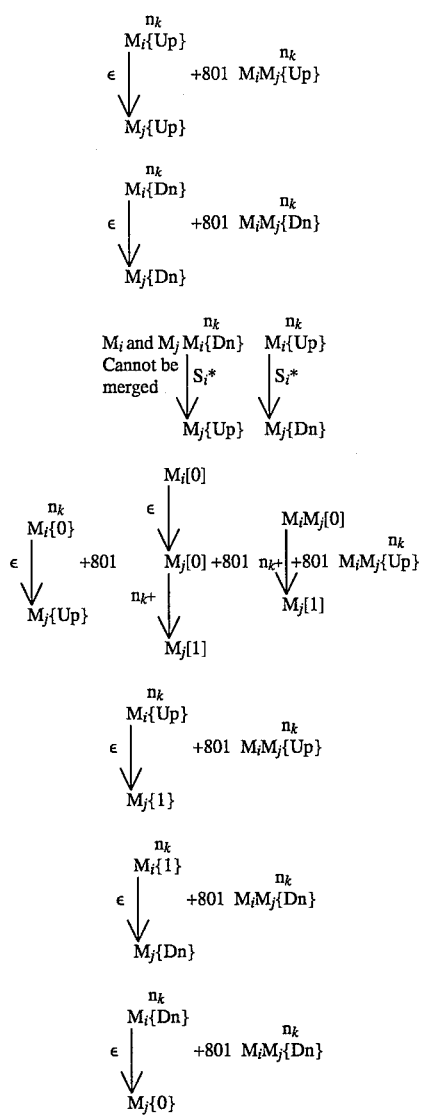

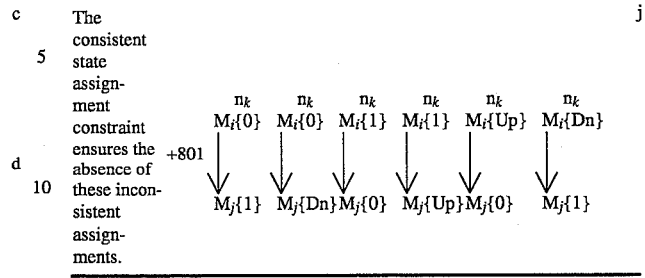

Case 2: If the state $M_i$ has an assignment value $n_{i,k}=0$ and the state $M_j$ has an assignment value $n_{j,k}=UP$ as illustrated in line f of Table 2, then the transition $Mi(n_{i,k}=0)$ to $M_j(n_{j,k}=UP)$ can be expanded into a transition sequence $M_i(0)$ to $M'_j(0)$ to $M''_j(1)$ as illustrated in line f. This new transition sequence is generated by including the state signal, $n_k$, in the modular state graph and including its value in its state encoding. This process divides the state $M_j$ into two different states, $M_j'(0)$ and $M_j''(1)$. The state $M_i(0)$ and $M_j'(0)$ have the same state code and are related through a silent transition. Thus, they can be merged together in the modular state graph. Finally, the transition sequence $M_i$ to $M'_j(0)$ to $M_j''(1)$ is merged into a single state $M'_{ij} M''_j$ (that is $M_iM_j$) with an UP assignment to the state signal $n_k$ as shown in line f. Similarly, if states $M_i$ and $M_j$ have assignment values $(n_{i,k}=UP, n_{j,k}=1)$, $(n_{i,k}=DOWN, n_{j,k}=0)$, and $(n_{i,k}=1, n_{j,k}=DOWN)$, then the merged state $M_iM_j$ will have an assignment value UP, DOWN and DOWN, respectively, as illustrated in boxes g, h, and i of Table 2.

Case 3: The rest of the state signal assignments indicted on box j of Table 2 are inconsistent with consistent state assignment constraints. Therefore, these state assignments cannot be assigned by the SAT algorithm.

Figure 6D:
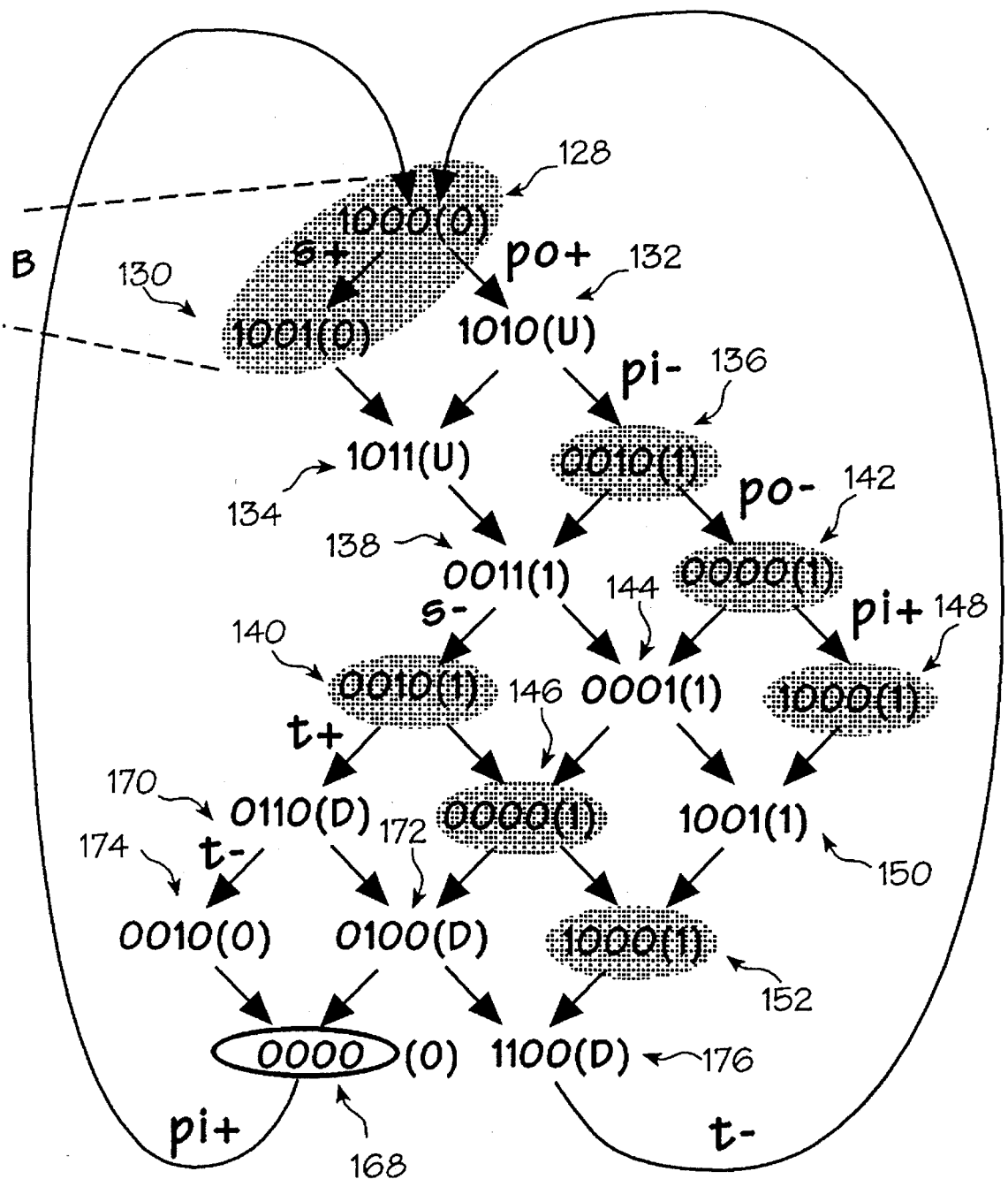
FIG. 6d is the complete state graph derived from the modular state graph FIG. 6c incorporating the added state signal.

The remaining CSC constraints in the modular state graph are satisfied by deriving a Boolean satisfiability formula in the manner as described above. The solution of this SAT formula give the state signal assignment values for every state in the modular graph. The new assignments resolve all the CSC conflicts in the modular state graph. These assignments from the modular state graphs are then communicated with the complete state graph as illustrated in FIG. 6d. A computer controlled methodology for modular state graph generation and constraint satisfaction is summarized below in Table 3.

TABLE 3

Input:   $\Sigma$: complete state graph.
Outputs: $\Sigma_{o_i}$: modular state graph belonging to output $o_i$. $n_s$new: new state signals.
procedure module_gen_and_constraint_satisfaction($\Sigma$, $\Sigma_{o_i}$, $n_s$new) {
    Merge states in $\Sigma$ connected by $I_S(o_i)$ transitions;
    Derive the modular state graph $\Sigma_{o_i}$;
    for each state signal in $I_S(o_i)$
        Derive state assignment in $\Sigma_{o_i}$ from $\Sigma$;
    $n_s$new := lower bound on state signals to resolve CSC conflicts in $\Sigma_{o_i}$;
    while (truth assignment is not found) {

TABLE 3-continued

```
        Derive a boolean constraint formula from Σ_{o_i} with n_snew state signals;
        Find a truth assignment for n_snew state signals using a SAT algorithm;
        if (the boolean formula is unsatisfiable)
            Add a new state signal to n_snew;
    }
}
```

An example will make this clear. Referring again to FIG. 6b, recall that the input signal set for the output po was derived as the set (pi, t, po). Since the STG signal s does not belong to this input set, in order to derive the modular state graph for the output po, all the transitions s were labelled as silent transitions. The value of the signal, s, is removed from the state code (pi, t, po, s) of FIG. 6a of the complete state graph. Thus, the state code of the modular state graph is (pi, t, po). The state sets 128 and 130, 132 and 134, 136 138 and 140, 142 144 and 146, 148 150 and 152 of the complete state graph of FIG. 6a are merged into states 154, 156, 158, 160 and 162, respectively, of the modular state graph of FIG. 6b. Note that at this stage in the analysis, there are no state signal assignments associated to the complete state graph of FIG. 6a, and the modular state graph does not require propagation of any state signal assignments from the complete state graph of FIG. 6a to FIG. 6b.

The modular state graph of FIG. 6b for the output po has three CSC conflicts and requires, therefore, one state signal to resolve them. The state conflicts include states 154 and 162, 158 and 164, and state 160 and 166. State assignments for state signal, $n_1$, are derived using the state CSC model described before. The modular state graph with a state signal, $n_1$, assigned to it is then derived as shown in FIG. 6c. The assignment of the state signal $n_1$ is then communicated with the complete state graph as shown in FIG. 6d. The same procedure is applied then to generate a modular state graph for the output s with the complete state graph in FIG. 6d.

Consider now how the propagation of the state signal assignment is made. In order to reduce CSC conflicts in the complete state graph, the new state signals in the modular graph must be propagated through to the complete state graph. The process of CSC constraint satisfaction in the modular graph and the state assignment propagation to the complete state graph is repeated for each output. By this means, all CSC conflicts can be removed from the complete state graph. In the worst case, all CSC conflicts in the complete state graph will be removed after all the modular state graphs for the output signals are derived.

In order to propagate the state signals to the complete state graph the definition of a cover is needed. A set of states ($M_1$, $M_2$, ... $M_k$) in the complete state graph is defined as covering a state M in the modular state graph if the states $M_1$, $M_2$, ... $M_k$ can be merged into M in the process of generating the modular state graph. This is denoted by cover ($M_1$)=cover($M_2$)=... =cover($M_k$)=M. The state assignments are simply propagated by adding the new state signal assignments of state M to the states $M_1$, $M_2$, ... $M_k$ that cover the state M. A software-driven algorithmic solution is summarized below in Table 4.

TABLE 4

```
Inputs:   Σ: complete state graph. n_snew: new state signals.
          Σ_{o_i}: modular state graph belonging to output o_i.
Output:   Σ: complete state graph with new state assignment.
procedure propagate_new_signal_assignment(Σ, Σ_{o_i}, n_snew) {
    for each state M_k in Σ {
```

TABLE 4-continued

```
        if (M_k can be merged with state M_l' in Σ_{o_i})
            cover(M_k) := state M_l' of Σ_{o_i};
    }
    for each state M_k in Σ
        Add new state assignments n_snew from state "cover(M_k)"
            of Σ_{o_i} to state M_k;
}
```

Turn again to the illustrated example shown in FIG. 6c and consider how the state signal $n_1$ assignments are propagated from the modular state graph for the output of po in FIG. 6c to the complete state graph in FIG. 6d. In the process of generating the modular state graph, the state sets 168, (128 and 130), (132 and 134), (136, 138 and 140), (142, 144 and 146), (148, 150 and 152), (170) (172), (174), and (176) in the complete state graph of FIG. 6d cover states 166, 154, 156, 158, 160, 162, 178, 180, 164, and 182, respectively, of the modular state graph of FIG. 6c. Thus, the assignments for the new state signal, $n_1$ that correspond to the state 166 in the modular graph of FIG. 6c are added to state 168 in the complete state graph of FIG. 6d. An assignment corresponding to state 154 in the modular state graph of FIG. 6c is then added to states 128 and 130 in the complete state graph of FIG. 6d. Similarly, each of the state assignments from the modular state graph is propagated to the covering states in the complete state graph of FIG. 6d as shown.

Figure 6E:
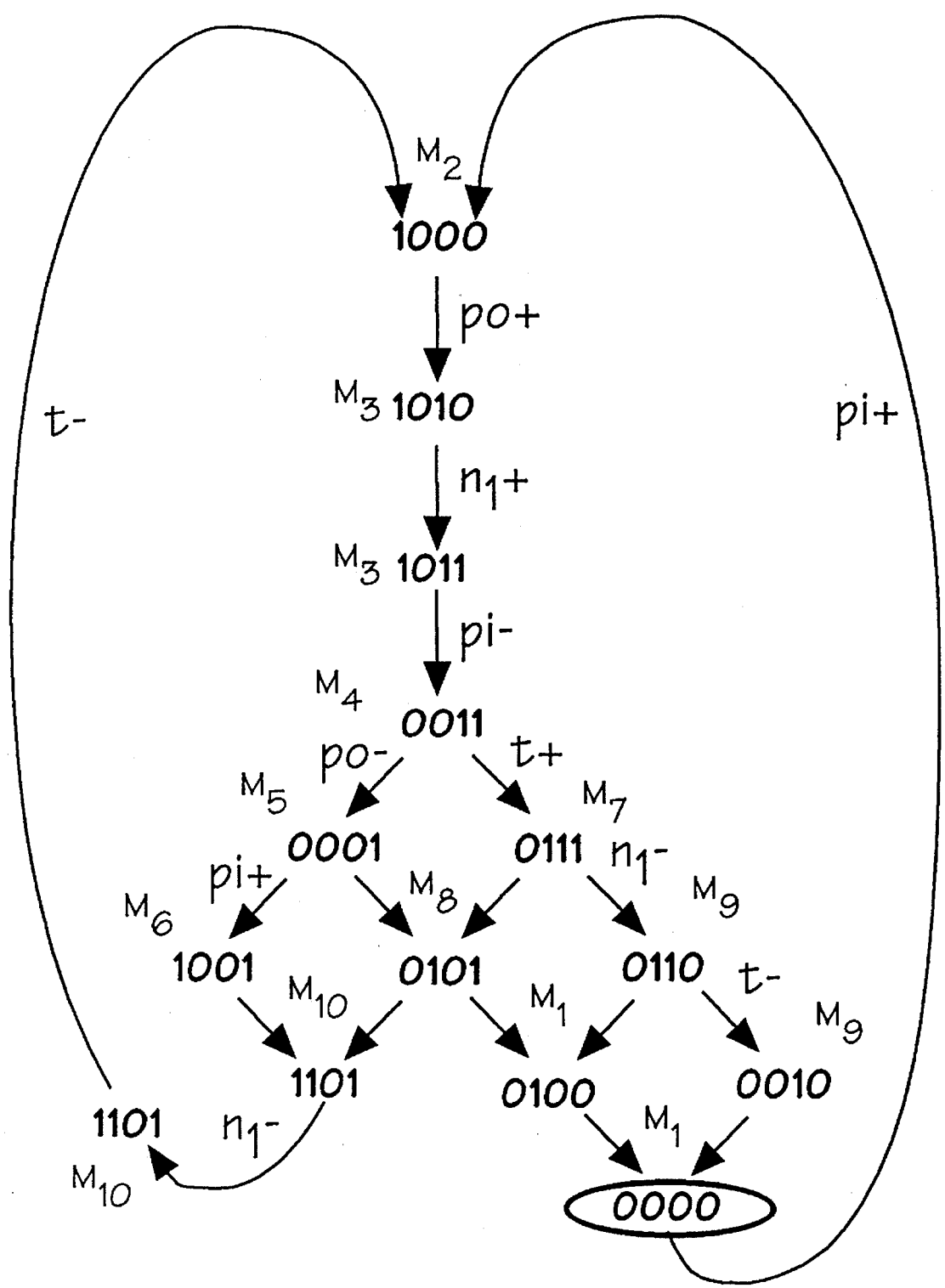
FIG. 6e is the expanded modular state graph derived from the modular state graph of FIG. 6b.

The partitioning process which generates the modular state graphs from the complete state graph with new state signal assignments is then repeated for every output in the signal transition graph. The modular state graph for every output can be expanded by a simple procedure to include the state signal transitions in the modular state graph such as is depicted in FIG. 6e. Alternatively, the complete state graph of FIG. 4c can be expanded with the state signal assignments and the output logic functions derived therefrom.

The logic function of an output, which is in the form of a summation of products, is obtained by simply finding the implied values of the STG outputs in every state of the expanded state graph such as shown in FIG. 4c. See Chu, "Synthesis of Self-Timed VLSI Circuits for Graph Theoretic Specifications," Department of Electrical Engineering Computer Science, MIT, June 1987.

Any conventional logic minimizer may then be applied to the resulting logic function. For example, a logic cover of the output logic function is obtainable by employing a conventional logic minimizer, such as sold by the University of California at Berkeley under the name, Espresso.

This cover may contain static and dynamic hazards which are then removable using conventional hazard removal techniques. See for example, Lavagno et al., "Algorithms for Synthesis of Hazard-Free Asynchronous Circuit," Proc. of 28th DAC, at 302–08 (1991) and Nowick et al., "Exact Two-Level Minimization of Hazard-Free Logic with Multiple Input Changes," Proc. of ICCAD (1992).

For example, with respect to the specific illustration described in FIG. 4c, the complete state graph with state signals $n_1$ and $n_2$ resolve all CSC conflicts in the given state graph and satisfy consistent assignment constraints and semimodularity constraints. The expanded state graph, derived from the complete state graph in FIG. 4c has 34 states. The logic function of the output signals, po, s and the state signals, $n_1$ and $n_2$, are derived from the logic cover from the Espresso program and are given by the equations:

$$po = pi\ t\ n_2$$

$$s = n_1 + s\ n_2$$

$$n_1 = s\ n_1 + pi\ t\ s\ n_2$$

$$n_2 = t + pi\ n_1 + s\ n_1\ n_2$$

The above set of logic functions are then reduced to the two-level implementation area which includes 18 literals. One algorithmic software-controlled solution for the complete procedure for modular synthesis of asynchronous circuits from the signal transition graphs is summarized below in Table 5.

C. An efficient implementation of a branch and bound algorithm provided with UC Berkeley logic synthesis tool SIS, Sentovich et al., "SIS: A System for Sequential Circuit Synthesis," Technical Report UCB/ERL M92/41, Department of EECS, University of California, Berkeley (1992), was used to solve the SAT formulas. See generally Stephen et al., "Combinatorial Test Generation Using Satisfied Ability," Technical Report UCB/ERL M92/112, Department of EECS, University of California, Berkeley (1992). The methodology was tested on a large number of signal transition graph benchmarks including Hewlett-Packard benchmarks as described by Lavagno et al., "Solving the State Assignment Problem for Signal Transition Graphs," Proc. of 29th DAC at 568–72 (1992). A Sun-Sparc 2 Workstation was utilized. The methodology of the invention was compared with other known techniques as shown by Lavagno supra and Vanbekbergan et al., "A Generalized State Assignment Theory for Transformations on Signal Transition Graphs," Proc. of ICCAD at 112–17 (1992). The results are summarized in Table 6.

TABLE 5

Input: STG specifications.
Output: Synthesized logic circuit.
Variables: $\Sigma$: complete state graph. $o_i$: output signal.
$I_S(o_i)$: input signal set belonging to output $o_i$.
$\Sigma_{o_i}$: modular state graph belonging to output $o_i$.
$n_s$: state signals in complete state graph $\Sigma$. $n_s^{new}$: new state signals.
Procedure modular_synthesis(STG) {
    Derive complete state graph $\Sigma$ from the given STG;
    $n_s := \{\ \}$;
    for each output signal $o_i$ {
        /* Determine the input signal set $I_S(o_i)$ belonging to output $o_i$ */
        determine_input_set($\Sigma$, $o_i$, $I_S(o_i)$));
        /* Derive $\Sigma_{o_i}$ and find $n_s^{new}$ and their assignments in $\Sigma_{o_i}$ */
        module_gen_and_constraint_satisfaction($\Sigma$, $\Sigma_{o_i}$, $n_s^{new}$);
        /* Propagate the assignment of new state signals from $\Sigma_{o_i}$ to $\Sigma$ */
        propagate—new—signal—assignment($\Sigma$, $\Sigma_{o_i}$, $n_s^{new}$);
    }
    Expand $\Sigma$ to include state signal transitions;
    Derive the logic circuit from the expanded state graph;
    return logic description of the circuit;
}

The methodology of the invention described above was demonstrated, for example, by machine solution written in

TABLE 6

| | Specifications | | Our Method (Decomposition) | | | | Vanbekbergen et al. [21] (No Decomposition) | | | | Lavagno and Moon et al. [9] | | |
|---|---|---|---|---|---|---|---|---|---|---|---|---|---|
| STG Name | Initial no. of states | Initial no. of signal | Final no. of staes | Final no. of signal | 2level Area literals | CPU time sec. | Final no. of states | Final no. of signal | 2level Area literals | CPU time sec. | Final no. of signal | 2level Area literals | CPU time sec. |
| mr0 | 302 | 11 | 469 | 14 | 41 | 2.80 | SAT Backtrack Limit | | | >3600 | 13 | 86 | 1084.5 |
| mr1 | 190 | 8 | 373 | 12 | 55 | 1.73 | SAT Backtrack Limit | | | 872.9 | 10 | 53 | 237.5 |
| mmu0 | 174 | 8 | 441 | 11 | 49 | 0.87 | SAT Backtrack Limit | | | 406.3 | Internal State Error* | | |
| mmu1 | 82 | 8 | 131 | 10 | 50 | 0.37 | SAT Backtrack Limit | | | 101.3 | 10 | 37 | 47.8 |
| sbuf-ram-write | 58 | 10 | 93 | 12 | 59 | 0.36 | 90 | 12 | 74 | 5.21 | 12 | 35 | 54.6 |
| vbe4a | 58 | 6 | 106 | 8 | 37 | 0.19 | 116 | 8 | 40 | 0.25 | 8 | 41 | 5.5 |
| nak-pa | 56 | 9 | 59 | 10 | 25 | 0.20 | 58 | 10 | 32 | 0.08 | 10 | 41 | 20.8 |
| pe-rcv-ifc-fc | 46 | 8 | 50 | 9 | 48 | 0.24 | 53 | 9 | 50 | 0.13 | 9 | 62 | 14.3 |
| ram-read-sbuf | 36 | 10 | 44 | 11 | 28 | 0.15 | 53 | 11 | 44 | 0.06 | 11 | 23 | 65.2 |
| alex-nonfc | 24 | 6 | 31 | 7 | 26 | 0.05 | 28 | 7 | 22 | 0.03 | Non-Free-Choice STG | | |
| sbuf-send-pkt2 | 21 | 6 | 26 | 7 | 20 | 0.04 | 27 | 7 | 29 | 0.04 | 7 | 14 | 8.6 |
| sbuf-send-ctl | 20 | 6 | 32 | 8 | 33 | 0.09 | 28 | 8 | 35 | 0.03 | 8 | 43 | 3.4 |
| atod | 20 | 6 | 26 | 7 | 15 | 0.02 | 24 | 7 | 16 | 0.01 | 7 | 19 | 2.9 |
| pa | 18 | 4 | 34 | 6 | 18 | 0.12 | 31 | 6 | 22 | 0.06 | Internal State Error* | | |
| alloc-outbound | 17 | 7 | 29 | 9 | 33 | 0.09 | 24 | 9 | 27 | 0.04 | 9 | 23 | 2.5 |
| wrdata | 16 | 4 | 20 | 5 | 17 | 0.03 | 19 | 5 | 18 | 0.01 | 5 | 21 | 0.9 |

TABLE 6-continued

| | Specifications | | Our Method (Decomposition) | | | | Vanbekbergen et al. [21] (No Decomposition) | | | | Lavagno and Moon et al. [9] | | |
|---|---|---|---|---|---|---|---|---|---|---|---|---|---|
| STG Name | Initial no. of states | Initial no. of signal | Final no. of staes | Final no. of signal | 2level Area literals | CPU time sec. | Final no. of states | Final no. of signal | 2level Area literals | CPU time sec. | Final no. of signal | 2level Area literals | CPU time sec. |
| fifo | 16 | 4 | 23 | 5 | 15 | 0.03 | 20 | 5 | 17 | 0.02 | 5 | 15 | 0.7 |
| sbuf-read-ctl | 14 | 6 | 18 | 7 | 16 | 0.06 | 16 | 7 | 20 | 0.01 | 7 | 15 | 1.5 |
| nousc | 12 | 3 | 16 | 4 | 12 | 0.01 | 16 | 4 | 12 | 0.01 | 4 | 14 | 0.5 |
| vbe-ex2 | 8 | 2 | 12 | 4 | 18 | 0.08 | 12 | 4 | 18 | 0.03 | 4 | 21 | 0.5 |
| nousc-ser | 8 | 3 | 10 | 4 | 9 | 0.02 | 10 | 4 | 9 | 0.01 | 4 | 11 | 0.4 |
| sendr-done | 7 | 3 | 10 | 4 | 8 | 0.02 | 10 | 4 | 8 | 0.01 | 4 | 6 | 0.4 |
| vbe-ex1 | 5 | 2 | 8 | 3 | 7 | 0.01 | 8 | 3 | 7 | 0.01 | 3 | 7 | 0.3 |

The number of literals were calculated from the unfactored prime-irredundant cover obtained using espresso-Dso-S1 options.
*The state splitting technique of [9] has not yet been implemented in the U. C. Berkeley logic synthesis tool SIS, which results in an internal state error in some cases [7].

Improved performance was obtained over prior art methods both in execution time and implementation area as shown. For example, in the case of the MR0 STG benchmark, the invention generated within 2.8 seconds with a two-level implementation area with 41 literals as compared to a circuit solution generated in 1084.5 seconds in an area of 86 literals using Lavagno's methodology. For the MR0 STG benchmark, Vanbekbergen's methodology could not yield a solution even within 3600 seconds and the program aborted due to a backtracking limit.

For the STG benchmark MMU0, a direct SAT formulation resulted in a SAT formula with 35,386 clauses and 1,044 variables. In contrast, the modular partition method of the invention required the solution with only three very small SAT formulas, one with 85 clauses and 18 variables and the other two with 954 clauses and 96 variables each. These three formulas are solvable within 0.87 seconds, compared to a preaborted 406.3 seconds for a direct SAT formulation. The use of direct SAT formulation as defined by Vanbekbergan are generally impractical for signal transition graphs with more than 100 states.

The area of a logic circuit synthesized by finding a logic cover with the use of the logic minimizer, Espresso, run with a single output exact minimization option (Espresso-DSO-S1) as compared to Lavagno's solution, on the average reduced the two-level implementation area by 12 percent over Vanbekbergen's direct synthesis method, and 9 percent as compared to Lavagno's methodology.

Figure 7:
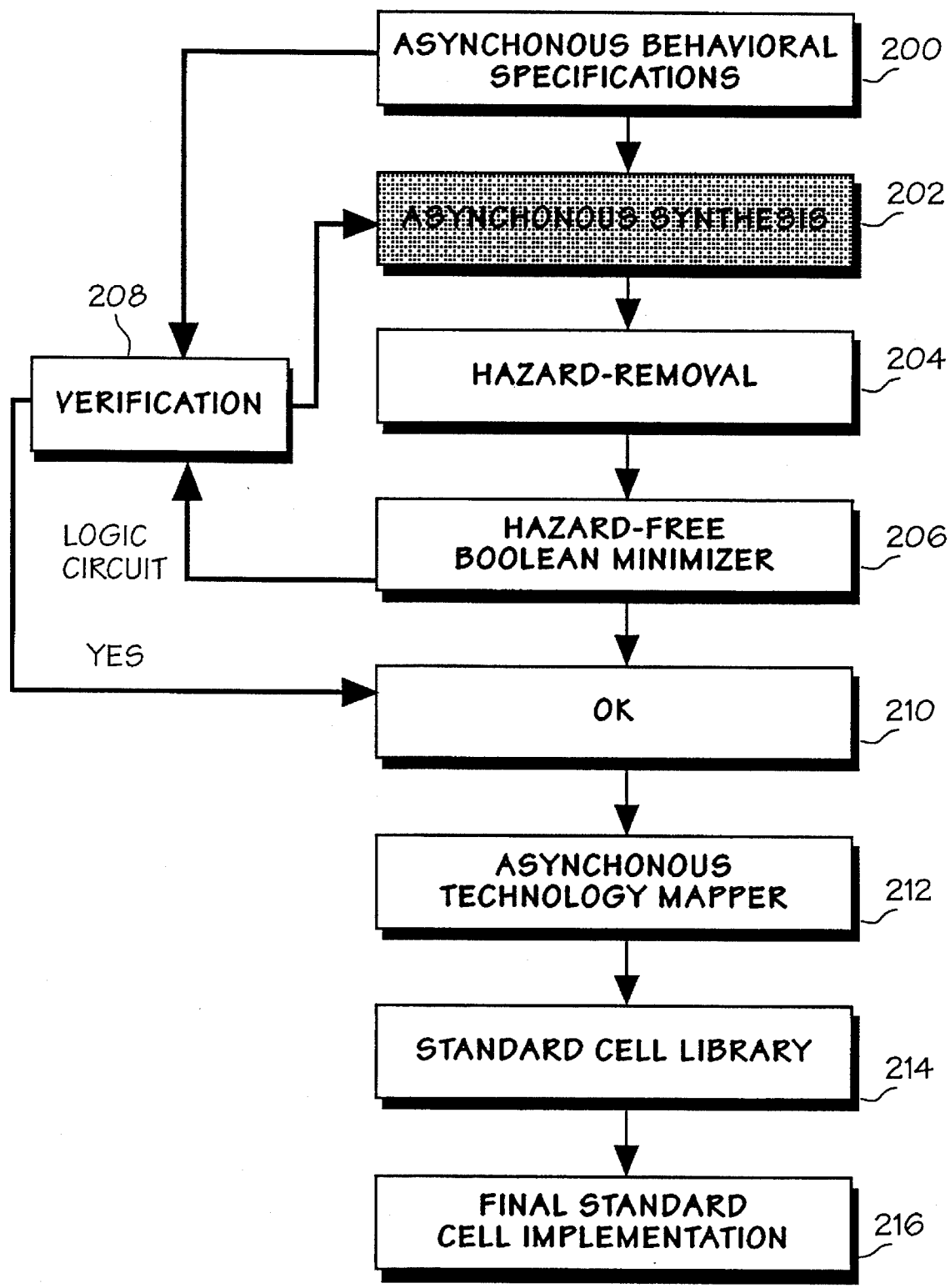
FIG. 7 is a block diagram which summarizes the entire machine methodology which is used to design asynchronous circuits.

FIG. 7 summarizes the overall methodology in which the invention is used. The process begins at step 200 by providing the asynchronous behavioral specifications in the form of the signal transition graphs. Asynchronous synthesis is then performed at step 202 according to the modular petitioning approach of the invention. Once the asynchronous synthesis is completed at step 202, the resulting Boolean expression is subject to conventional hazard removal at step 204. Having then obtained a hazard-free Boolean expression, satisfying the asynchronous behavioral specifications provided at step 200, this Boolean expression may be minimized using a conventional Boolean minimizer at step 206. If desired, a logic circuit may be derived and verified at step 208 against the asynchronous behavioral specification provided at step 200. If the verification is positive, processing may continue to step 210, otherwise, asynchronous synthesis is reperformed at step 202. Having then obtained a verified hazard-free Boolean expression in minimized form, a conventional asynchronous technology mapper, such as Siegel et. al., "Automatic Technology Mapping for Generalized Fundamental-Mode Asynchronous Designs," Proc. of ACM/IEEE Design Automation Conference (1993), translates the Boolean expression into literals or logic devices at step 212. Given the logic devices and the technology in which the devices are to be implemented, such as CMOS, NMOS, gallium arsenide, or the like, a standard cell library 214 is accessed and the resulting asynchronous circuit can then be schematically diagrammed and/or appropriate masks generated at step 216.

Figure 8:
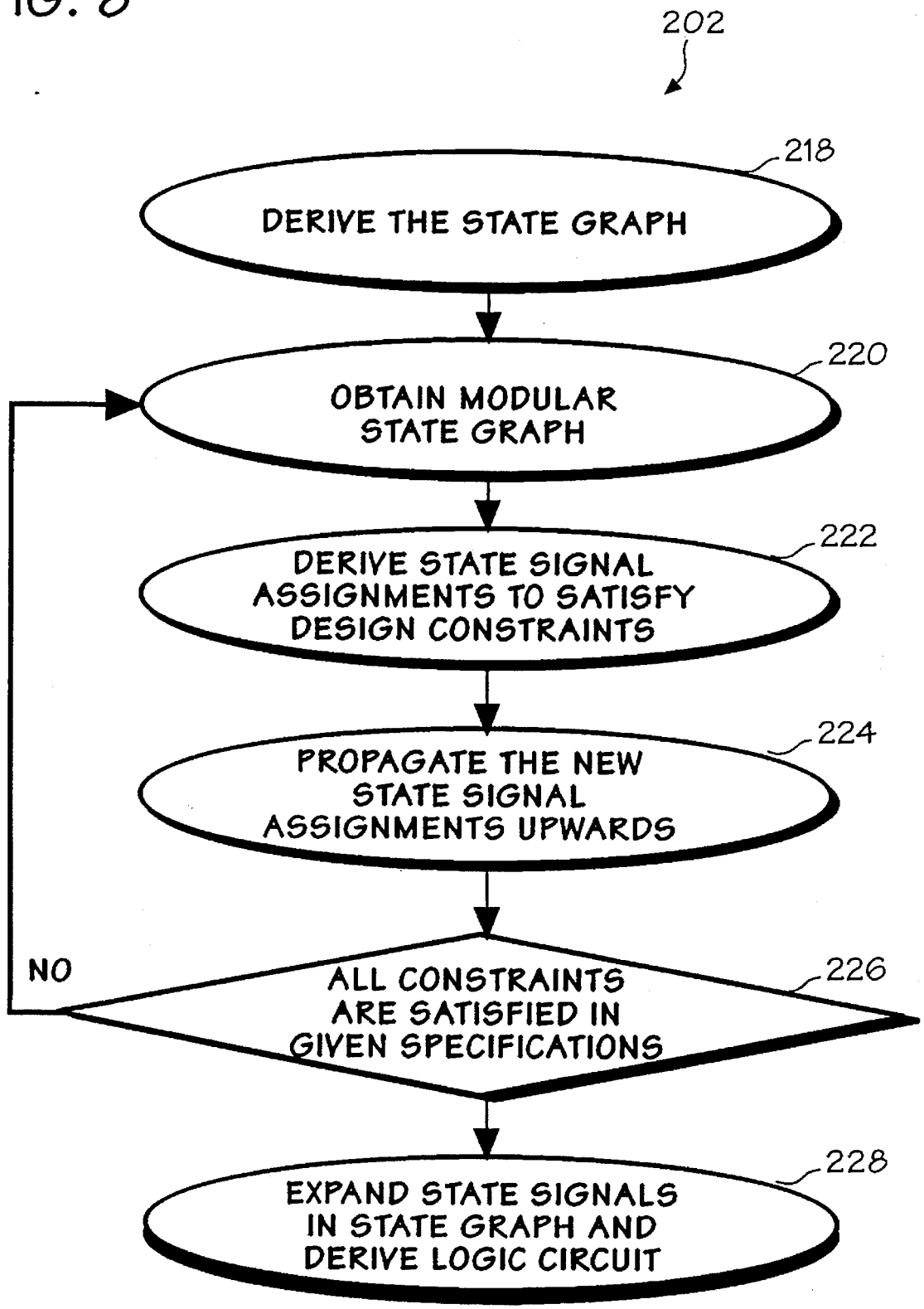
FIG. 8 is a block diagram of the asynchronous synthesis shown in FIG. 7.

The asynchronous synthesis of the invention at step 202 is summarized greater detail in FIG. 8. The state graph is derived at step 218 as describe above from which a modular state graph is derived at step 220. The state signal assignments are then generated which will satisfy the design constraints at step 222 for the modular state graph derived at step 220. The new state signal assignments then are propagated upward to the complete state graph at step 224. If all the constraints are satisfied in a given specification as determined at step 226, the state signals are expanded into the complete state graph and the logic circuit is derived at step 228. If all constraints are not satisfied as determined at step 226, then the process returns to step 220 to derive additional modular state graphs until all constraints are satisfied. The goal of asynchronous circuit design is to find a truth table to the state variable such that all the constraints are satisfied and the minimal circuit structure is found. The SAT-circuit design problem is the general constraint optimization problem. The SAT formula and the SAT-circuit problem may not necessarily be in the desired conjunctive normal form. To solve the SAT circuit design problem using conventional techniques, such as resolution, backtracking, local search and global optimization, the formula must be transformed into the conjunctive normal form, but the size of the formula is likely to explode or become unmanageable.

In addition to finding the truth values of the state variables such that all the constraints are satisfied, it is also important to find an optimal solution which will provide a minimal circuit structure from the Boolean formula. Until now, the goal has been unattainable in the general case.

Figure 9:
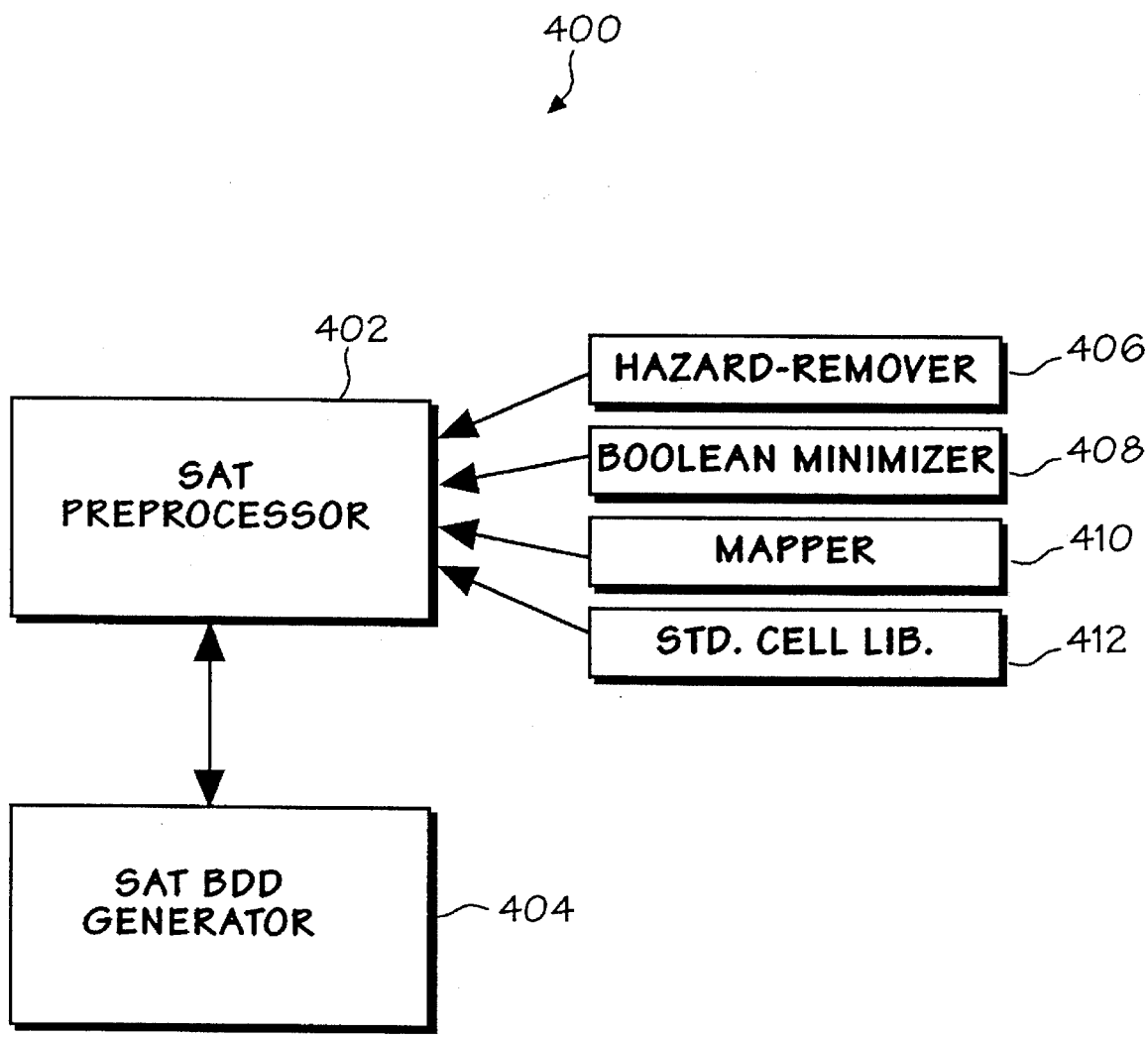
FIG. 9 is a block diagram of the BDD SAT solver used in one embodiment of the invention.

The present invention also includes, for example, a binary decision diagram (BDD) SAT solver 400 shown in FIG. 9 which can be used for practical asynchronous design to reduce chip implementation area. The solver is comprised of a structural SAT formula preprocessor 402 and a complete incremental SAT algorithm generator 404 that generates an optimal solution with minimum circuit structure. SAT algorithm generator 404 performs the functions of step 222 in the method illustrated in FIG. 8. The balance of the steps in FIG. 8 are performed by preprocessor 402. SAT algorithm generator 404 is known in the art and is generally described by Bryant, "Graph-Based Algorithms for Boolean Function Manipulation," IEEE Transactions on Computers, 35(8): 677–91 (1986). The combination of a conventional SAT algorithm generator 404 with the preprocessor 402 of the invention results in an improved and practical embodiment for currently used asynchronous circuits.

Preprocessor 402 initially compresses a large size SAT formula that represents a given asynchronous circuit design into a number of smaller SAT formulas. This avoids the problem of solving a very large SAT formula. Each of the smaller size SAT formulas is then solved, that is the states are found by a BDD SAT algorithm. The results of these subproblems are integrated together to contribute a solution to the complete or original asynchronous circuit design.

The SAT formula incorporates the CSC, consistent state assignment and semimodularity constraints. If the formula is unsatisfiable, then a new state signal is added. This in turn generates a new SAT formula. The truth assignment satisfying the above constraints is then deemed a feasible solution to the SAT-circuit design problem.

In practical asynchronous circuit design, minimal circuit structure with the least amount of structural redundancy is required. The goal is to derive a circuit with maximal amount of "don't care" states, that is inputs for which the outputs are unspecified. A minimal circuit structure can thus be obtained by removing the "don't cares" from the derived circuit.

Figure 10:
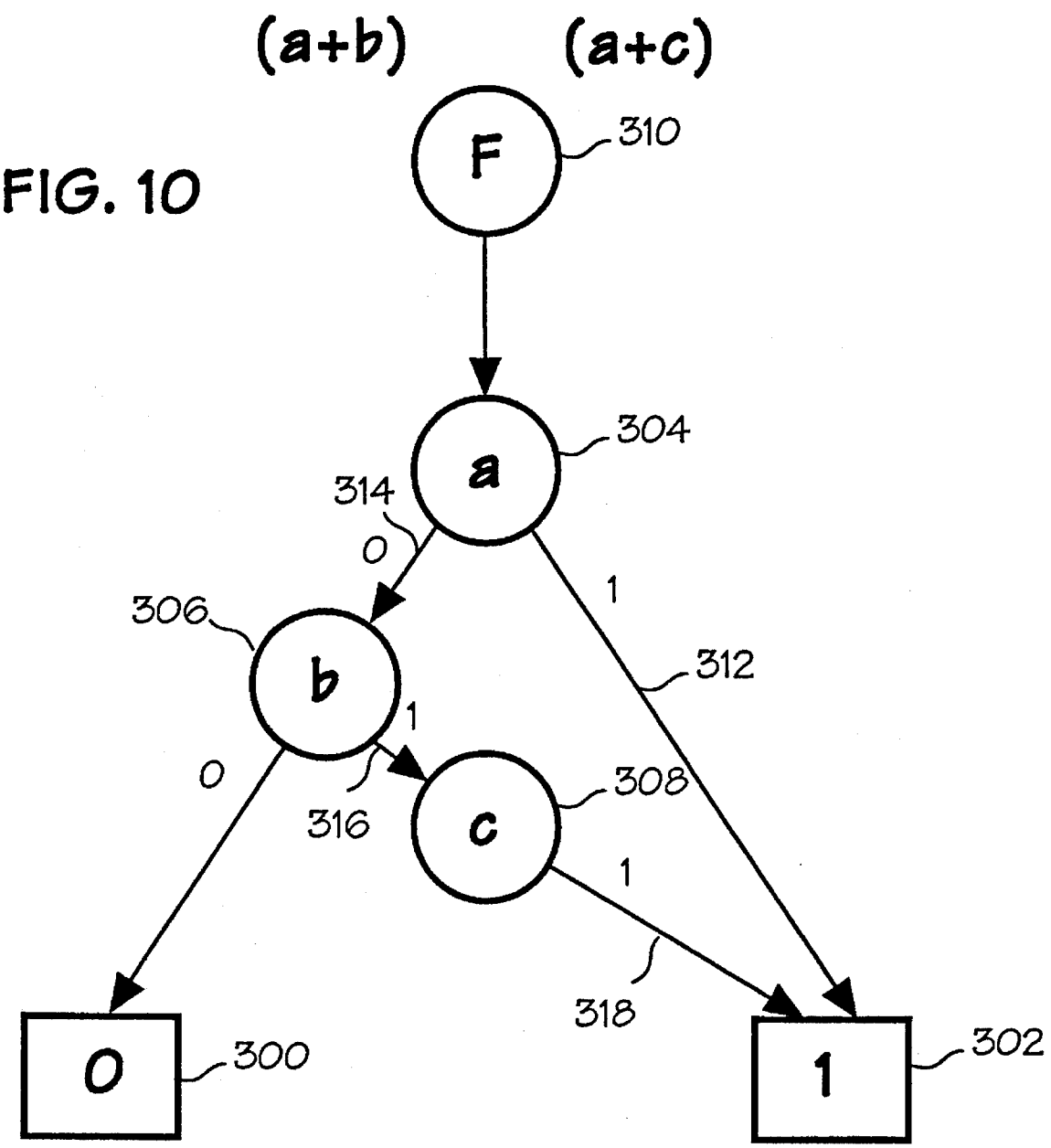
FIG. 10 is an example of a simple binary decision diagram.

The optimization of the invention can be understood by viewing the simple example shown in FIG. 10 which is an acyclic graph. The graph of FIG. 10 has two leaf nodes, 0 and 1, respectively denoted by reference numerals 300 and 302. The nonleaf nodes are labelled with the Boolean variables which in the example are a, b, and c and which are denoted in FIG. 10 by reference numerals 304, 306 and 308, respectively. Each of the nonleaf nodes has two outgoing edges, a left edge which is labelled 0, and a right edge in FIG. 10 which is labelled 1. Every path in the binary decision diagram of FIG. 10 is unique, that is no path contains nodes with the same variables. This means that if we arbitrarily trace out a path from the function node F 310 to leaf node 1 302, then we have automatically determined the value assignment to the function variables for which the function will be 1 regardless of the values of the other variables. In other words, function F at node 310 will evaluate as true for the variable values as labelled on each path ultimately leading to the leaf node 1, 302.

In the simple example of F=(A+B)(A+C) the binary decision diagram of FIG. 10 has at its root node 304 of the variable a. If a=1, than F=1 as depicted by path 312. If a=0 and b=0, then F=0 at node 300. Otherwise, if b=1, then c at node 308 is viewed to determined the value F which in this case will be the value equal to c. The values of the variables will then be determined by a path made up of segments 314, 316 and 318. Each of the paths shown in heavy outline in FIG. 10 therefore represents a satisfiable assignment to the formula F, namely for the triplet (a, b, c) the satisfiable assignments are (1,–,–) and (0,1,1) where "–" denotes a "don't care" assignment.

It is well known that the size of the binary decision diagram for a function depends on the order of the variables chosen for that function. Several methodologies have been proposed to reduce the size of the binary decision diagram in practical applications. One is an ordered binary decision diagram which is generated with the constraint that the input variables are ordered that every path from the root node to the leaf node visits the input variables in ascending order. In practice, simple topological based ordering heuristic will yield small size binary decision diagrams for practical Boolean applications. See Malick et al, "Logic Verification Using Binary Decision Diagrams in Logic Synthesis Environment," Proc. of ACM/IEEE International Conference on CAD (1988). A reduced ordered binary decision diagram is an ordered binary decision diagram in which each node represents a unique logic function. It is known that a reduced ordered binary decision diagram is well-defined and is a canonical representation of the Boolean function, that is two Boolean functions are equivalent if their reduced ordered binary decision diagram are isomorphic. See Bryant, "Graph-Based Algorithms for Boolean Function Manipulation," IEEE Transactions on Computers, 35(8): 677–91 (1986).

Many practical problems in digital circuit design require the numeration of possible assignments for a given Boolean formula. The best assignment that yields the minimum costs, for example, minimum circuit structure, minimum chip area, and maximum circuit speed, is then selected from the possible assignments. Since most of the prior art algorithms for satisfiability testing are designed for finding a single truth assignment, they are impractical to be used in selecting an optimal assignment. Binary decision diagrams are useful in optimal selections since a simple and incremental enumeration of all possible paths from the root node to the leaf node 1 yields all the truth assignments. Thus, once the binary decision diagram for a Boolean function has been constructed, the enumeration of all assignments and the choice of the optimal one among them is straightforward.

The binary decision diagram SAT solver of the invention yields an average of a 20 percent reduction in the circuit implementation area with respect to prior art techniques such as shown by Lavagno for all circuits relating to practical asynchronous circuit benchmarks such as provided by Hewlett-Packard Research Labs in Palo Alto, Calif. and Phillips Research Labs of Belgium. See Table 7.

TABLE 7

| | Benchmark | | BDD SAT Solver | | | Lavagno and Moon et al. [26] | | |
| --- | --- | --- | --- | --- | --- | --- | --- | --- |
| Benchmark Name | Initial no. of state | Initial no. of states | Final no. of signal | Implementation Area (literals) | CPU time sec. | Final no. of signal | Implementation Area (literals) | CPU time sec. |
| Mr0 | 302 | 11 | 15 | 41 | 58.36 | 13 | 86 | 1084.5 |
| Mmu1 | 82 | 8 | 10 | 38 | 28.16 | 10 | 37 | 47.8 |
| SbufRamWr | 58 | 10 | 12 | 47 | 32.79 | 12 | 35 | 54.6 |
| Vbe4a | 58 | 6 | 8 | 30 | 1.95 | 8 | 41 | 5.5 |
| NakPa | 56 | 9 | 10 | 25 | 0.53 | 10 | 41 | 20.8 |
| RamRdSbuf | 36 | 10 | 11 | 25 | 0.25 | 11 | 23 | 65.2 |
| SbufSndPkt2 | 24 | 6 | 7 | 21 | 0.37 | 7 | 14 | 8.6 |

TABLE 7-continued

| | Benchmark | | BDD SAT Solver | | | Lavagno and Moon et al. [26] | | |
|---|---|---|---|---|---|---|---|---|
| Benchmark Name | Initial no. of state | Initial no. of states | Final no. of signal | Implementation Area (literals) | CPU time sec. | Final no. of signal | Implementation Area (literals) | CPU time sec. |
| SbufSndCt1 | 21 | 6 | 7 | 17 | 0.37 | 8 | 43 | 3.4 |
| AtoD | 20 | 6 | 8 | 30 | 18.27 | 7 | 19 | 2.9 |
| Pa | 20 | 6 | 7 | 14 | 0.15 | | Internal State Error | |
| WrData | 16 | 4 | 5 | 18 | 0.05 | 5 | 21 | 0.9 |
| Fifo | 16 | 4 | 5 | 15 | 0.14 | 5 | 15 | 0.7 |
| SbufRdCt1 | 14 | 6 | 7 | 16 | 0.05 | 7 | 15 | 1.5 |
| NoUsc | 12 | 3 | 4 | 12 | 0.09 | 4 | 14 | 0.5 |
| VbeEx2 | 12 | 3 | 4 | 12 | 0.09 | 4 | 21 | 0.5 |
| NoUscSer | 8 | 2 | 4 | 18 | 3.94 | 4 | 11 | 0.4 |
| AlexNonFc | 8 | 3 | 4 | 9 | 0.06 | | Non-Free-Choice STG | |
| SendrDone | 7 | 3 | 4 | 8 | 0.05 | 4 | 6 | 0.4 |
| VbeEx1 | 5 | 2 | 3 | 6 | 0.03 | 3 | 7 | 0.3 |

The SAT formula is generated subsequent to consistent state assignments, semimodularity and CSC constraints. The binary decision diagram is then generated from the SAT formula. The binary decision diagram yields a solution of the SAT formula that give a value assignment to function variables for every state in the modular state graph required to satisfy the CSC violations. All possible assignments to the functions are enumerated by simple depth first traversal of the paths in the binary decision diagram graph.

The number of satisfiable assignments, that is all paths from the root node to the leaf node 1 with the even number inversions may be very large for large binary decision diagrams. Thus, enumeration of all the possible paths may be computationally consuming. It is well known that logic minimization techniques utilize the number of don't care assignments to yield a reduced circuit structure and implementation area. Since minimization of the asynchronous circuit structure and implementation area is a desirable goal, an assignment is chosen according to the invention, that is a path through the binary decision diagram, that maximizes the assignments of "don't cares" to the state variables. This accomplished by means described below.

Figure 11A:
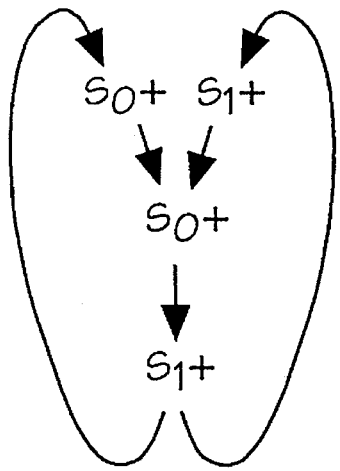
FIG. 11a is an illustrated STG.
Figure 11B:
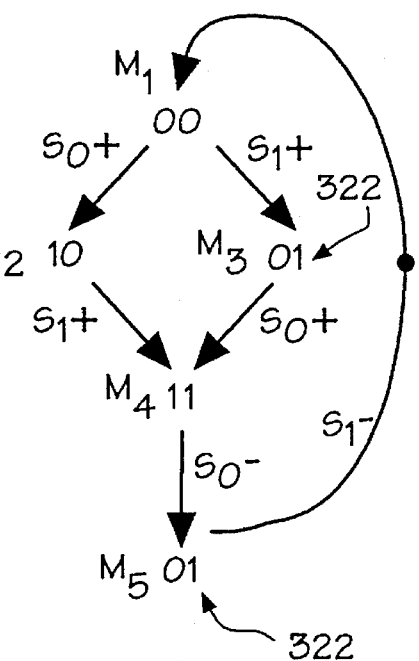

A specific example will make this clear. Consider a simple signal transition graph as shown in FIG. 11a which shows a circuit specification with an input $s_0$ and an output $s_1$. By means described above, a state graph such as shown in FIG. 11b is derived from the signal transition graph of FIG. 11a. In the example, the state graph has five states (00), (10), (01), (11) and (01). The states 320 and 322 in FIG. 11b violate the CSC constraint since they have the same state code, (01), and enable different output signals, namely the output $s_1$ is enabled in state 322 but not enabled in state 320. The CSC constraint is satisfied by the insertion of a state variable, $n_1$, which is a 4-tuple having the value (0, 1, UP and DOWN) which may also be represented by a pair of binary numbers. The state signal associates one state variable with every state in the state graph of FIG. 11b. The five state variables corresponding to the five states in the state graph of FIG. 11b are, $n_{0,1}$, $n_{1,1}$, $n_{2,1}$, $n_{3,1}$, and $n_{4,1}$. The CSC, consistent state assignment and semimodularity constraints on the state graph of FIG. 11b are encoded in terms of these variables. This generates a Boolean formula, $F_{BDD}$.

Figure 11C:
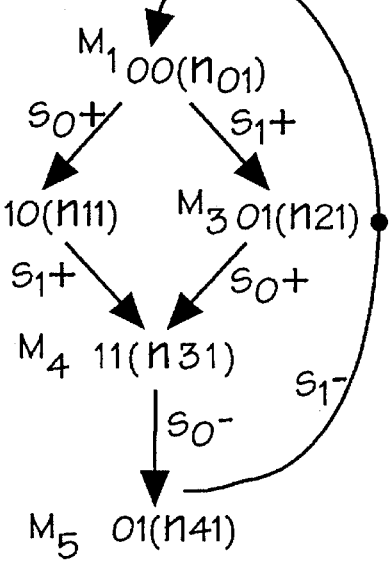
FIG. 11c is the state graph of FIG. 11b after a state signal has been added to correct for constraint violations.
Figure 11D:
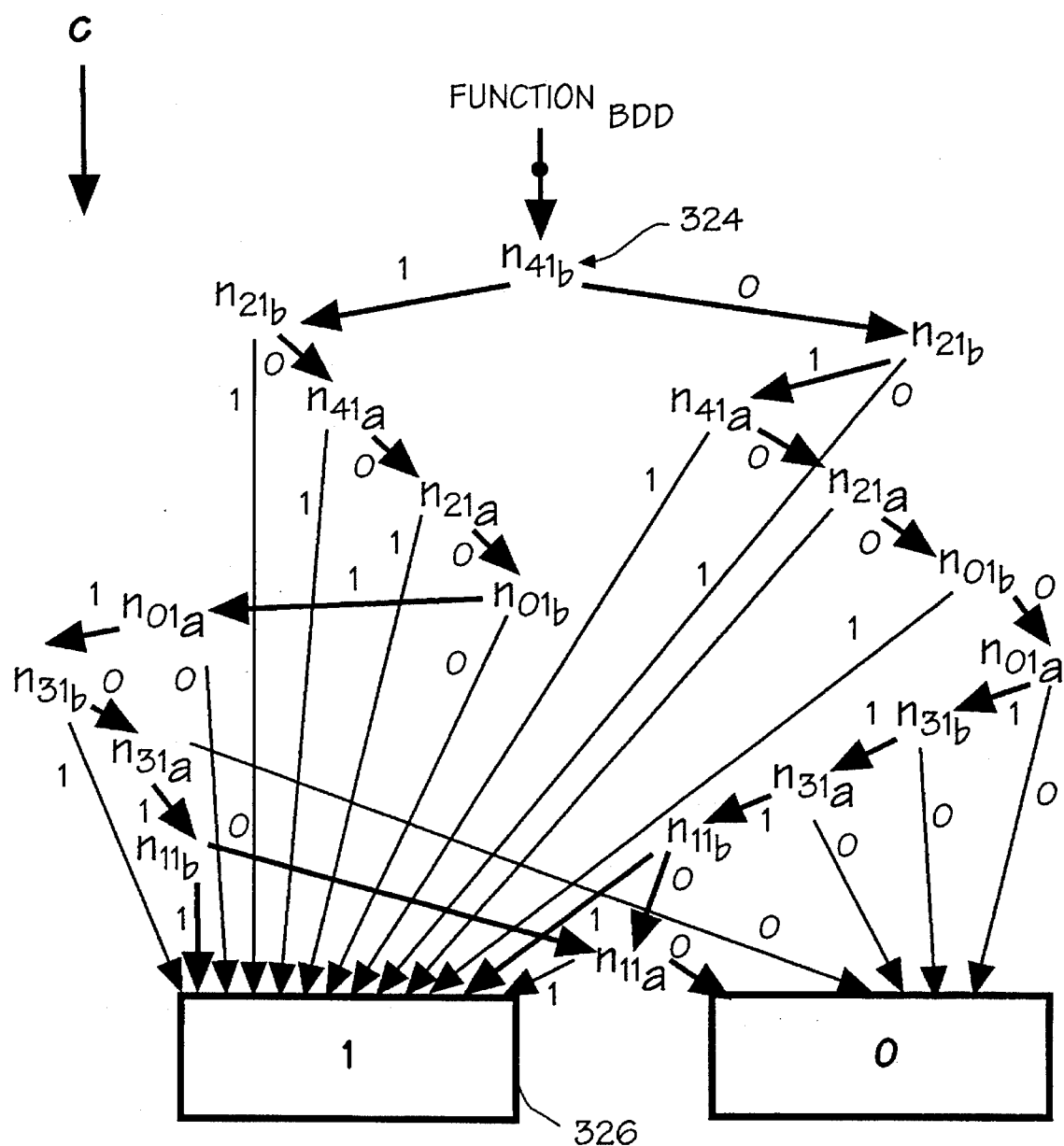
FIG. 11d is the binary decision diagram of the state graph of FIG. 11c.

The problem now becomes to find a truth assignment to the state variables in FIG. 11c so that the function $F_{BDD}$ is satisfied. The binary decision diagram for the function $F_{BDD}$ is generated and is shown in FIG. 11d. See Bryant, supra. All the satisfiable paths from root node 324 to leaf node 1, 326, having an even number of inversion indicated by an even number of dots on the path are shown in thickened path lines. Each thickened path gives a satisfiable assignment to the function $F_{BDD}$.

To minimize circuit structure and implementation area, the number of entries in the "don't care" sets of functions implementing the signal transition graph output signals are maximized. The network function derivation process described below expands every state in the state graph with an UP or DOWN state variable assignment into two states, namely one with a 0 assignment and the other one with a 1 assignment. An UP or DOWN state variable assignment thus generates two entries in the output function on/off sets. On the other hand, a 1 or a 0 value assignment to the state variable generates only a single entry in the output function on/off set. The number of entries in the output functions "don't care" sets can be maximized by minimizing the UP or DOWN state variable assignments. In the binary decision tree, a shorter path from the root node 324 to leaf node 1, 326, assigns 0 or 1 values to lesser number of state variables as compared to the number of assignments on a longer path. That is, the number of entries in a "don't care" set can be maximized by selecting the shortest path from the root node 324 to leaf node 1, 326, that is by choosing a path that assigns 0 or 1 values to the minimum number of state variables. The sparse nature of a binary decision diagram can be efficient utilized by employing a simple breadth first search shortest path algorithm such as disclosed in Table 8 below.

TABLE 8

Input: boolean formula.
Output: A satisfiable assignment with maximum number of don't care state variable assignments.
Procedure bdd_bfs_shortest_path( ) {
    Derive a BDD from the given boolean formula;
    Initialize labeling index i with 0;
    Label the BDD root node with 0;
    while (leaf node 1 is unlabeled) }

TABLE 8-continued

```
    S := {all unlabeled nodes adjacent to at least one none labeled i};
    if(S = { }) stop; /* error: no path from root to leaf node 1 */
    Label all the nodes in S with i + 1;
    Increment i;
    }
    i₁ := label of leaf node 1;
    Trace the path p from leaf node 1 to the root node by choosing successively
        adjacent nodes with labels i₁ − 1, i₁ − 2, . . . , 0 respectively;
    Output the state variable assignment corresponding to the shortest path p;
}
```

The algorithm of Table 8 yields a satisfiable assignment with a maximum number of don't cares. The time complexity of a breadth first search shortest path algorithm is O(absolute value E) where absolute value E denotes the number of edges in the graph. The binary decision diagram with n nodes has 2n edges. Thus, the time complexity of a breadth first search shortest path algorithm on a binary decision diagram is O(n). These don't care assignments are exploited by a conventional logic minimizer to yield a substantial reduction in circuit structure and implementation area.

For example, in the binary decision diagram of FIG. 11d the Boolean function, $F_{BDD}$, has four satisfiable paths that are highlighted by being shown in thickened line width. The shortest path with the maximum don't cares along the path is selected. In the illustration of FIG. 11d, this yields an implementation area of reduction of 1 literal, that is a reduction from 7 to 6 literals after logic minimization.

The solution of the Boolean formula gives the number of new state signals required to resolve the CSC violations and the state signal assignment values for every state in the modular state graph. The new assignments resolve all the CSC conflicts in the modular state graph. These assignments from the modular state graph are communicated to the complete state graph. The propagation of new state signal assignments from the modular state graph to the complete state graph was described in connection with FIGS. 6c and 6d.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims. The following claims are, therefore, to be read to include not only the combination of elements which are literally set forth, but all equivalent elements for performing substantially the same function in substantially the same way to obtain substantially the same result. The claims are thus to be understood to include what is specifically illustrated and described above, what is conceptionally equivalent, and also what essentially incorporates the essential idea of the invention.

We claim:

1. A computer implemented method for machine design of an asynchronous digital circuit on a semiconductor material having at least one output comprising the steps of:

defining asynchronous behavioral specifications for said asynchronous digital circuit to be designed;

generating a signal transition graph corresponding to said asynchronous behavioral specifications for said asynchronous digital circuit;

generating a complete state graph from said signal transition graph;

generating a modular state graph from said complete state graph for an output $o_i$;

generating state signal assignments to satisfy predetermined design constraints for said modular state graph;

propagating state signal assignments upward from said modular state graph to said complete state graph;

repeating said steps of generating said modular state graph, generating said state signal assignments, and propagating said state signals from said modular graph to said complete state graph for each output of said asynchronous digital circuit;

generating expanded state signals in said complete state graphs;

generating a design for logic circuits from said expanded complete state graph meeting each of said predetermined constraints and satisfying said asynchronous behavioral specification, and laying out said design for said logic circuits on said semiconductor material, whereby practical asynchronous digital circuits are machine designed and laid out on said semiconductor material with minimized circuit structure and minimized circuit area implementation on said semiconductor material.

2. The method of claim 1 wherein said step of generating said modular state graph is comprised of the steps of generating an input signal set, $Is(o_i)$, belonging to each of said plurality of outputs $o_i$ by removing all possible signals from said complete state graph not in said input signal set to decrease complete state coding conflicts.

3. The method of claim 1 wherein said step of generating said state signal assignments for said modular state graph comprises the step of generating a truth assignment to a Boolean satisfiability formula satisfying said modular state graph representing said predetermined constraints.

4. The method of claim 1 where in said step of generating said state signal assignments to satisfy said predetermined constraints in said modular state graph, said predetermined constraints comprise at least constraints of consistent assignment, semimodularity and complete state coding.

5. The method of claim 2 where said step of generating said input signal set for said output $o_i$ comprises the steps of:

generating a new temporary modular state graph for said output $o_i$ for each other signal $s_i$ not in said input signal set by merging states connected by $s_i$ transitions;

generating a digital number indicating if the number of complete state coding conflicts has been reduced;

including said signal $s_i$ in said generated input signal set of said output $o_i$ if said number of complete State coding conflicts have not been reduced.

6. The method of claim 1 wherein said step of generating said state signal assignments in said modular state graph comprises the step of generating a four-tuple state number for each state in said modular state graph to satisfy said predetermined constraints.

7. The method of claim 1 wherein said step of propagating state signal assignments of each state in said modular state graph to said complete state graph comprises the step of adding a new state signal assignment associated with state M in said modular state graph to each of said states in said complete state graph that cover said state M in said modular state graph.

8. The method of claim 1 wherein said step of generating a design for asynchronous logic circuits comprises the step of generating a logic function in the form of sum of products obtained by generating implied values of signal transition graph outputs in every state of said expanded state graph.

9. The method of claim 8 further comprising the step of removing hazards from said logic function of said output.

10. The method of claim 9 further comprising the step of generating a logic cover of said output logic function by use of a logic minimizer.

11. The method of claim 10 further comprising the step of verifying that said logic cover of said output logic function satisfies said asynchronous behavioral specifications.

12. The method of claim 11 further comprising the step of generating a map of a logic description corresponding to said asynchronous behavioral specifications based on said logic cover.

13. The method of claim 12 further comprising the step of implementing said logic map in an integrated circuit layout according to a selected cell library.

14. The method of claim 1 further comprising the step of:
generating a binary decision diagram from said modular state graph; and
generating a shortest path from a root node of said binary decision diagram to a leaf node 1 of said binary decision diagram by choosing a path through said binary decision diagram that assigns binary 0 or 1 values to a minimum number of state variables to reduce circuit structure and implementation area.

15. An apparatus for machine generating asynchronous distal circuit designs comprising:
a preprocessor for partitioning a complete state graph into a plurality of smaller modular state graphs;
a Boolean satisfiability solver for generating state signal assignments to satisfy a plurality of predetermined constraints for each of said smaller modular state graphs, whereafter said preprocessor propagates said state signal assignments upward from said smaller modular state graph to said complete state graph; and
a synthesizer for combining output from said Boolean satisfiability solver for each of said smaller modular state graphs in an expanded complete state graph; and
an asynchronous technology mapper for generating a logic circuit design corresponding to said expanded complete state graph.

16. The apparatus of claim 15 further comprising a hazard remover for removing dynamic and static logic hazards from said expanded state graph generated by said synthesizer.

17. The apparatus of claim 16 further comprising a Boolean minimizer for minimizing Boolean structure from a Boolean function output, said Boolean minimizer coupled to said hazard remover to minimize hazard-free Boolean output derived from said synthesizer through said hazard remover.

18. The apparatus of claim 15 wherein said Boolean satisfiability solver is a binary decision diagram solver.

19. The apparatus of claim 18 wherein said binary decision diagram solver maximizes don't-care sets of functions implementing signal transition graph output signals from said preprocessor to reduce circuit structure and implementation area.

* * * * *